US011101103B2

(12) United States Patent
Shiratsuchi et al.

(10) Patent No.: US 11,101,103 B2
(45) Date of Patent: Aug. 24, 2021

(54) MULTIPLE ELECTRON BEAM INSPECTION APPARATUS AND MULTIPLE ELECTRON BEAM INSPECTION METHOD

(71) Applicant: NuFlare Technology, Inc., Yokohama (JP)

(72) Inventors: Masataka Shiratsuchi, Kawasaki (JP); Riki Ogawa, Kawasaki (JP); Hiromu Inoue, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 16/777,967

(22) Filed: Jan. 31, 2020

(65) Prior Publication Data

US 2020/0286709 A1    Sep. 10, 2020

(30) Foreign Application Priority Data

Mar. 6, 2019    (JP) .............................. JP2019-041027

(51) Int. Cl.
*H01J 37/244*    (2006.01)
*H01J 37/24*    (2006.01)

(52) U.S. Cl.
CPC ............ *H01J 37/244* (2013.01); *H01J 37/24* (2013.01); *H01J 2237/153* (2013.01); *H01J 2237/2448* (2013.01); *H01J 2237/24578* (2013.01)

(58) Field of Classification Search
CPC .... H01J 37/244; H01J 37/24; H01J 2237/153; H01J 2237/24578; H01J 2237/2448; H01J 2237/1532; H01J 2237/223; H01J 37/22; H01J 37/28; H01J 2237/2817; H01J 2237/2826; H01J 37/045; H01J 2237/0435; H01J 2237/31774; H01J 2237/1534; H01J 2237/221; H01J 2237/2446; H01J 2237/24465; H01J 2237/24542; H01J 2237/30433; H01J 2237/30472;

(Continued)

(56) References Cited

U.S. PATENT DOCUMENTS 10,134,562 B2 *  11/2018  Kato .................... H01J 37/304
10,607,812 B2 *   3/2020  Inoue .................... H01J 37/20

(Continued)

FOREIGN PATENT DOCUMENTS

JP    2017-83301 A    5/2017
JP    2020-87507 A    6/2020

*Primary Examiner* — David A Vanore
(74) *Attorney, Agent, or Firm* — Oblon, McClelland, Maier & Neustadt, L.L.P.

(57) ABSTRACT

A multiple electron beam inspection apparatus includes a correction circuit that corrects a partial secondary electron image of partial secondary electron images configuring a secondary electron image and obtained by irradiation with a corresponding primary electron beam of the multiple primary electron beams such that the partial secondary electron image becomes close to a uniform beam partial image when an irradiation region of a primary electron beam corresponding to the partial secondary electron image is irradiated with a uniform beam obtained by equalizing shapes and sizes of all primary electron beams, by using a function for individual correction of each primary electron beam, for each of the plural partial secondary electron images, and an inspection circuit that performs inspection using plural partial secondary electron images each corrected.

10 Claims, 19 Drawing Sheets

(58) Field of Classification Search
CPC .......... H01J 2237/31766; H01J 37/243; G01N 23/2251; G01N 21/95607; G01N 2223/426
See application file for complete search history.

(56) References Cited

U.S. PATENT DOCUMENTS

| | | | |
|---|---|---|---|
| 10,629,406 B2* | 4/2020 | Ogasawara | H01J 37/244 |
| 10,712,295 B2* | 7/2020 | Tsuchiya | G03F 7/7065 |
| 10,755,893 B2* | 8/2020 | Nishimura | H01J 37/3045 |
| 10,777,384 B2* | 9/2020 | Kikuiri | H01J 37/28 |
| 10,796,877 B2* | 10/2020 | Izumi | H01J 37/1472 |
| 10,840,057 B2* | 11/2020 | Ishii | H01J 37/28 |
| 10,867,774 B2* | 12/2020 | Iizuka | H01J 37/3177 |
| 10,886,102 B2* | 1/2021 | Inoue | H01J 37/145 |
| 10,896,801 B2* | 1/2021 | Inoue | G06T 7/001 |
| 10,916,406 B2* | 2/2021 | Matsumoto | H01J 37/304 |
| 10,930,469 B2* | 2/2021 | Nakayama | H01J 37/3174 |
| 2017/0122890 A1 | 5/2017 | Inoue et al. | |
| 2017/0352140 A1* | 12/2017 | Isomura | G06T 7/001 |
| 2018/0114673 A1* | 4/2018 | Matsumoto | H01J 37/3177 |
| 2019/0096631 A1* | 3/2019 | Takekoshi | H01J 37/268 |
| 2019/0304737 A1* | 10/2019 | Ogasawara | H01J 37/226 |
| 2020/0161082 A1* | 5/2020 | Inoue | H01J 37/222 |
| 2021/0005422 A1* | 1/2021 | Nakashima | H01J 37/3177 |

\* cited by examiner

MULTIPLE ELECTRON BEAM INSPECTION APPARATUS AND MULTIPLE ELECTRON BEAM INSPECTION METHOD

CROSS-REFERENCE TO RELATED APPLICATION

This application is based upon and claims the benefit of priority from prior Japanese Patent Application No. 2019-041027 filed on Mar. 6, 2019 in Japan, the entire contents of which are incorporated herein by reference.

BACKGROUND OF THE INVENTION

Field of the Invention

Embodiments of the present invention relate to a multiple electron beam inspection apparatus and a multiple electron beam inspection method. For example, embodiments of the present invention relate to an inspection apparatus for inspecting a pattern by using a secondary electron image of the pattern emitted by irradiation with multiple electron beams.

In recent years, with the advance of high integration and large capacity of LSI (Large Scale Integrated circuits), the line width (critical dimension) required for circuits of semiconductor elements is becoming progressively narrower. Since LSI manufacturing requires a tremendous amount of manufacturing cost, it is crucially essential to improve its yield. However, as typified by a 1-gigabit DRAM (Dynamic Random Access Memory), the scale of patterns configuring an LSI is in transition from on the order of sub-microns to on the order of nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultrafine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there are "die-to-die inspection" and "die-to-database inspection". The "die-to-die inspection" method compares data of measured images acquired by imaging the same patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After performing alignment between images, the comparison circuit compares the measured data with reference data according to an appropriate algorithm, and determines that there is a pattern defect if the compared data do not match with each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another inspection apparatus that acquires a pattern image by scanning the inspection substrate with electron beams and detecting secondary electrons emitted from the inspection substrate by the irradiation with the electron beams. Regarding the inspection apparatus utilizing electron beams, an apparatus using multiple beams has also been under development. With respect to a multiple electron beam inspection apparatus, each beam should be uniform because a minute difference between observation objects needs to be detected. However, in real multiple beams, it is difficult to completely eliminate a difference of shape or size between beams. If there is a shape or size difference between beams, a difference depending on beam characteristics occurs between images acquired with different beams. Therefore, a precise inspection may not be performed when comparing inspection images acquired with different beams, which results in a serious problem for realizing the inspection apparatus.

There is disclosed a technique in which after individually correcting distortion of an image of a region to be scanned by each of multiple beams, region images to be scanned by circumferential beams are connected to perform further correction of distortion, and an inspection image obtained by connecting the region images is compared with a reference image (e.g., refer to Japanese Patent Application Laid-open (JP-A) No. 2017-083301). This technique is for correcting distortion between beams in one inspection image so as to use an image obtained by connecting images by a plurality of beams, as an inspection image.

BRIEF SUMMARY OF THE INVENTION

According to one aspect of the present invention, a multiple electron beam inspection apparatus includes a secondary electron image acquisition mechanism that acquires a secondary electron image by applying multiple primary electron beams to a substrate where figure patterns are formed, and detecting multiple secondary electron beams emitted from the substrate by irradiation with the multiple primary electron beams;

a correction circuit that corrects a partial secondary electron image of partial secondary electron images which configure the secondary electron image such that the partial secondary electron image becomes close to a uniform beam partial image which is acquired by the secondary electron image acquisition mechanism in a case where an irradiation region of a primary electron beam corresponding to the partial secondary electron image is irradiated with a uniform beam obtained by equalizing shapes and sizes of all primary electron beams of the multiple primary electron beams, using a function for individual correction of each primary electron beam of the multiple primary electron beams, for each of the partial secondary electron images; and an inspection circuit that performs inspection using the partial secondary electron images each corrected.

According to another aspect of the present invention, a multiple electron beam inspection method includes acquiring a secondary electron image by applying multiple primary electron beams to a substrate where figure patterns are formed, and detecting multiple secondary electron beams emitted from the substrate by irradiation with the multiple primary electron beams;

correcting a partial secondary electron image of partial secondary electron images which configure the secondary electron image such that the partial secondary electron image becomes close to a uniform beam partial image which is acquired by irradiating an irradiation region of a primary electron beam corresponding to the partial secondary electron image with a uniform beam obtained by equalizing shapes and sizes of all primary electron beams of the multiple primary electron beams, using a function for individual correction of each primary electron beam of the multiple primary electron beams, for each of the partial secondary electron images; and performing inspection using the partial secondary electron images each corrected.

DETAILED DESCRIPTION OF THE INVENTION

A first embodiment of the present invention describes an inspection apparatus and method that can adjust inspection images acquired with different beams to be close to images acquired under the same conditions.

First Embodiment

Figure 1:
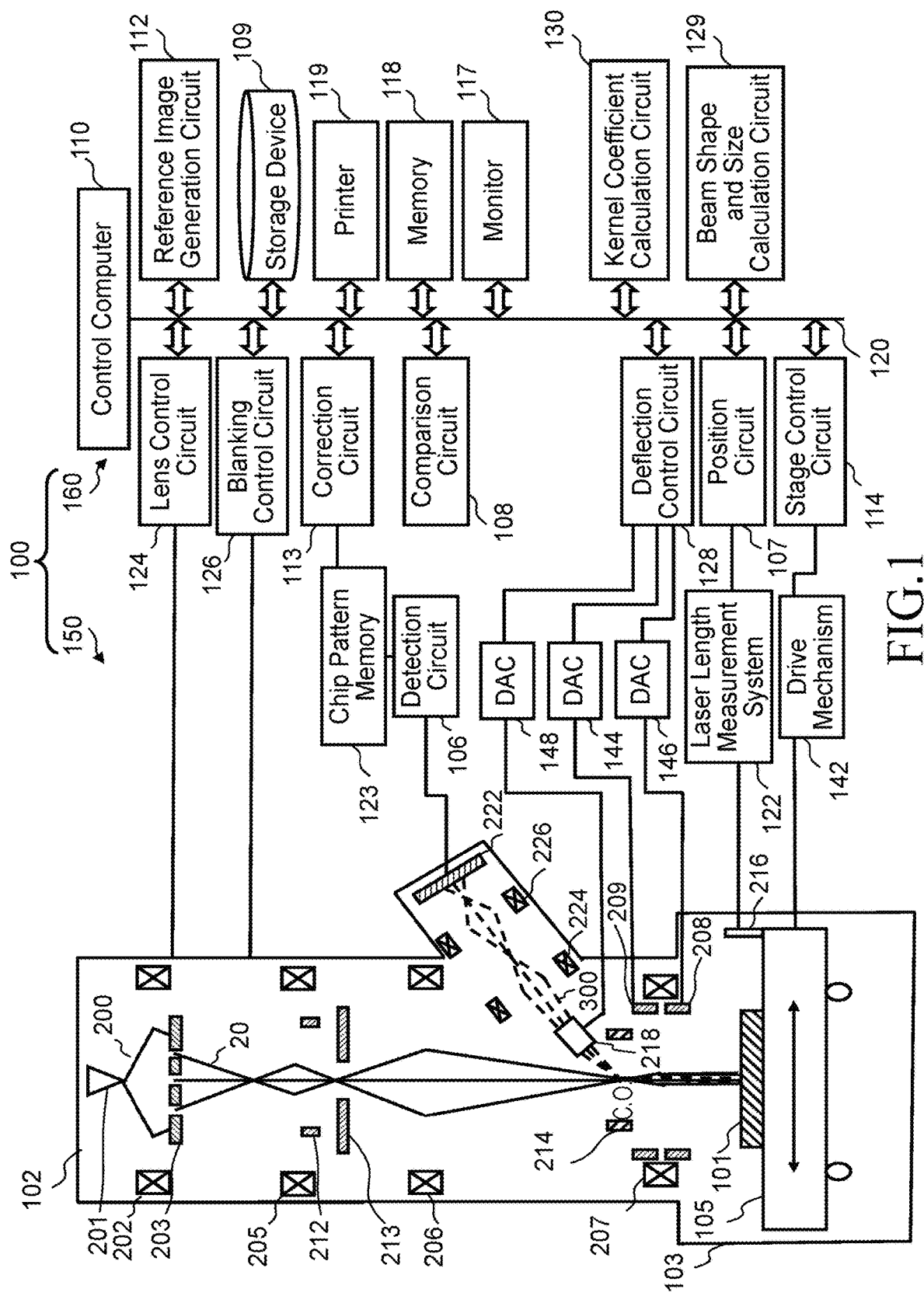
FIG. 1 is a block diagram showing an example of a configuration of a pattern inspection apparatus according to a first embodiment.

FIG. 1 is a block diagram showing an example of a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 (secondary electron image acquisition mechanism) and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a common blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, an electromagnetic lens 226, and a multi-detector 222.

A stage 105 movable at least in the x, y, and z directions is disposed in the inspection chamber 103. A substrate 101 (target object) to be inspected is mounted on the stage 105. The substrate 101 may be an exposure mask substrate, or a semiconductor substrate such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the stage 105, for example. Moreover, on the stage 105, there is disposed a mirror 216 which reflects a laser beam for measuring a laser length emitted from the laser length measuring system 122 disposed outside the inspection chamber 103. The multi-detector 222 is connected, at the outside of the electron beam column 102, to the detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a correction circuit 113, a stage control circuit 114, a lens control circuit 124, a blanking control circuit 126, a deflection control circuit 128, a beam shape and size calculation circuit 129, a kernel coefficient calculation circuit 130, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The chip pattern memory 123 is connected to the correction circuit 113. The stage 105 is driven by the drive mechanism 142 under the control of the stage control circuit 114. In the drive mechanism 142, a drive system such as a three (x-, y-, and θ-) axis motor which provides drive in the directions of x, y, and θ in the stage coordinate system is configured, and can move the stage 105 in the x, y, and θ directions. A step motor, for example, can be used as each of these x, y, and θ motors (not shown). The stage 105 is movable in the horizontal direction and the rotation direction by the X-, Y-, and θ-axis motors. Further, the stage 105 is movable in the z direction (height direction) by using a piezoelectric element, etc., for example. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. In the stage coordinate system, the x, y, and θ directions are set with respect to a plane perpendicular to the optical axis (center axis of electron trajectory) of the multiple primary electron beams, for example.

The electromagnetic lenses 202, 205, 206, 207 (objective lens), 224 and 226, and the beam separator 214 are controlled by the lens control circuit 124. The common blanking deflector 212 is configured by two or more electrodes (or "two or more poles"), and each electrode is controlled by the blanking control circuit 126 through a DAC amplifier (not shown). The sub deflector 209 is configured by four or more electrodes (or "four or more poles"), and each electrode is controlled by the deflection control circuit 128 through the DAC amplifier 144. The main deflector 208 is configured by four or more electrodes (or "four or more poles"), and each electrode is controlled by the deflection control circuit 128 through the DAC amplifier 146. The deflector 218 is configured by four or more electrodes (or "four or more poles"), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, applying a voltage to another extraction electrode (Wehnelt) and heating the cathode to a predetermined temperature are performed, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
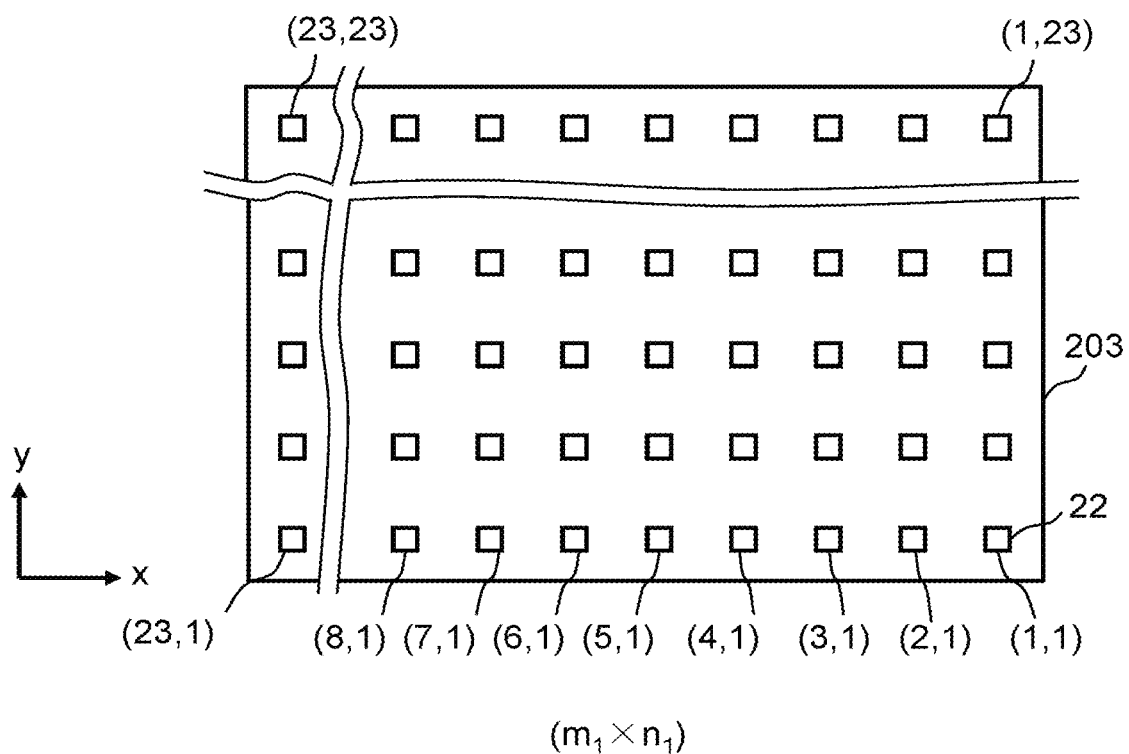
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ rows long (length in the y direction) (each row in the x direction) and $n_1$ columns wide (width in the x direction) (each column in the y direction) are two-dimensionally formed at a predetermined arrangement pitch in the shaping aperture array substrate 203, where $m_1$ and $n_1$ are integers of 2 or more. In the case of FIG. 2, holes 22 of 23×23 are formed. Ideally, each of the holes 22 is a rectangle (including a square) having the same dimension, shape, and size. Alternatively, ideally, each of the holes 22 may be a circle with the same outer diameter. Multiple primary electron beams 20 are formed by letting portions of the electron beam 200 individually pass through a corresponding one of a plurality of holes 22. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where the holes are arranged like a grid in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2)th row may be mutually displaced in the width direction (in the x direction) by a dimension "b".

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple primary electron beams 20 are formed by letting portions of the electron beam 200, which irradiate the positions of a plurality of holes 22, individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens) while repeating forming an intermediate image and a crossover through the beam separator 214 disposed at the crossover position of each beam of the multiple primary electron beams 20. Then, the electromagnetic lens 207 focuses the multiple primary electron beams 20 onto the substrate 101. The multiple primary electron beams 20 having been focused on the substrate 101 (target object) by the objective lens 207 are collectively deflected by the main deflector 208 and the sub deflector 209 to irradiate respective beam irradiation positions on the substrate 101. When all of the multiple primary electron beams 20 are collectively deflected by the common blanking deflector 212, they deviate from the hole in the center of the limiting aperture substrate 213 and blocked by the limiting aperture substrate 213. On the other hand, the multiple primary electron beams 20 which were not deflected by the common blanking deflector 212 pass through the hole in the center of the limiting aperture substrate 213 as shown in FIG. 1. Blanking control is provided by On/Off of the common blanking deflector 212 to collectively control On/Off of the multiple beams. Thus, the limiting aperture substrate 213 blocks the multiple primary electron beams 20 which were deflected to be in the "Off condition" by the common blanking deflector 212. Then, the multiple primary electron beams 20 for inspection (for image acquisition) are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation by the multiple primary electron beams 20.

The multiple secondary electron beams 300 emitted from the substrate 101 travel to the beam separator 214 through the electromagnetic lens 207.

The beam separator 214 generates an electric field and a magnetic field to be perpendicular to each other in a plane perpendicular to the traveling direction of the center beam of the multiple primary electron beams 20 (that is, electron trajectory central axis). The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20.

The multiple secondary electron beams 300 having been bent obliquely upward and separated from the multiple primary electron beams 20 are further bent by the deflector 218, and projected, while being refracted, onto the multi-detector 222 by the electromagnetic lenses 224 and 226. The multi-detector 222 detects the projected multiple secondary electron beams 300. It is acceptable that reflected electrons and secondary electrons are projected on the multi-detector 222, or that reflected electrons are emitted on the way and remaining secondary electrons are projected. The multi-detector 222 includes a two-dimensional sensor (not shown), for example. Each secondary electron of the multiple secondary electron beams 300 collides with a corresponding region of the two-dimensional sensor, generates an electron, and generates secondary electron image data for each pixel. In other words, in the multi-detector 222, a detection sensor is disposed for each primary electron beam 13$i$ of the multiple primary electron beams 20, where i indicates an index, and i=1 to 529 in the case of the multiple primary electron beams 20 being composed of 23×23 beams. Then, the detection sensor detects a corresponding secondary electron beam emitted by irradiation with each primary electron beam 13$i$. Therefore, each of a plurality of detection sensors in the multi-detector 222 detects an intensity signal of a secondary electron beam for an image, which is resulting from irradiation with a corresponding primary electron beam 13$i$, and outputs the intensity signal (image data). The intensity signal detected by the multi-detector 222 is output to the detection circuit 106.

Figure 3:
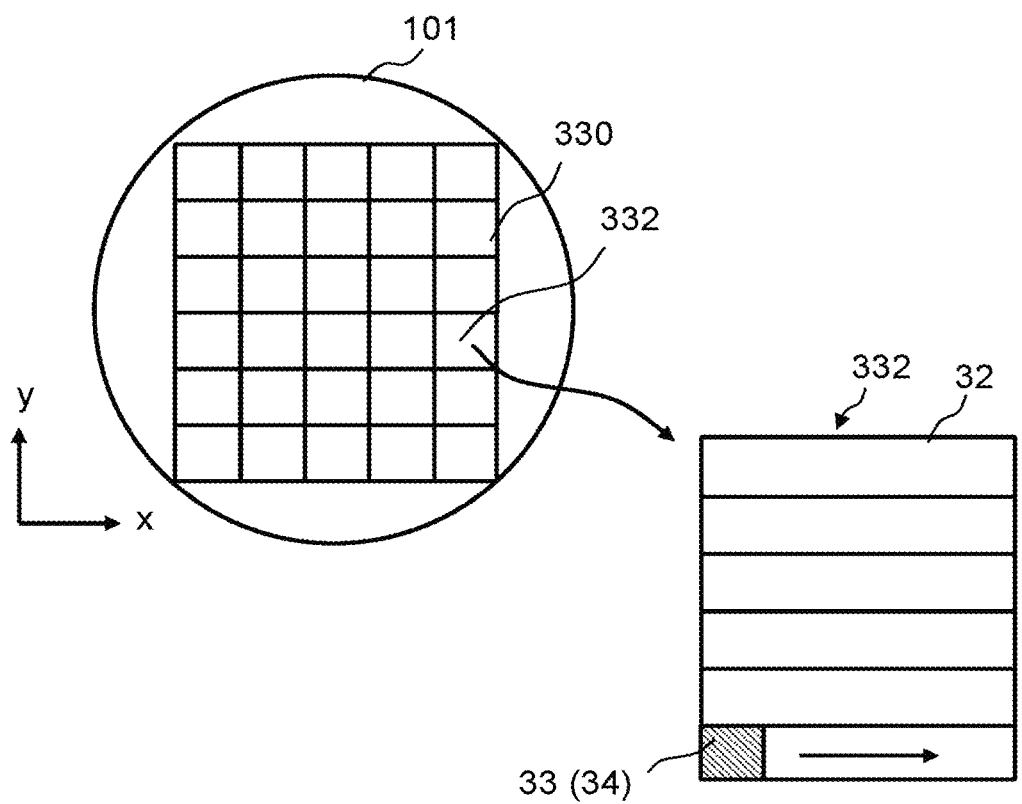
FIG. 3 shows an example of a plurality of chip regions formed on a semiconductor substrate, according to the first embodiment.

FIG. 3 shows an example of a plurality of chip regions formed on a semiconductor substrate, according to the first embodiment. In FIG. 3, in the case of the substrate 101 being a semiconductor substrate (wafer), a plurality of chips (wafer dies) 332 in a two-dimensional array are formed in an inspection region 330 of the semiconductor substrate (wafer). A mask pattern for one chip formed on an exposure mask substrate is reduced to ¼, for example, and exposed/ transferred onto each chip 332 by an exposure device (stepper) (not shown). The region of each chip 332 is divided into a plurality of stripe regions 32 by a predetermined width being in the y direction, for example. The scanning operation by the image acquisition mechanism 150 is carried out for each stripe region 32, for example. Each stripe region 32 is divided into a plurality of unit blocks 33 in the longitudinal direction. Beam application to the unit block 33 is achieved by collectively deflecting all the multiple beams 20 by the main deflector 208.

Figure 4:
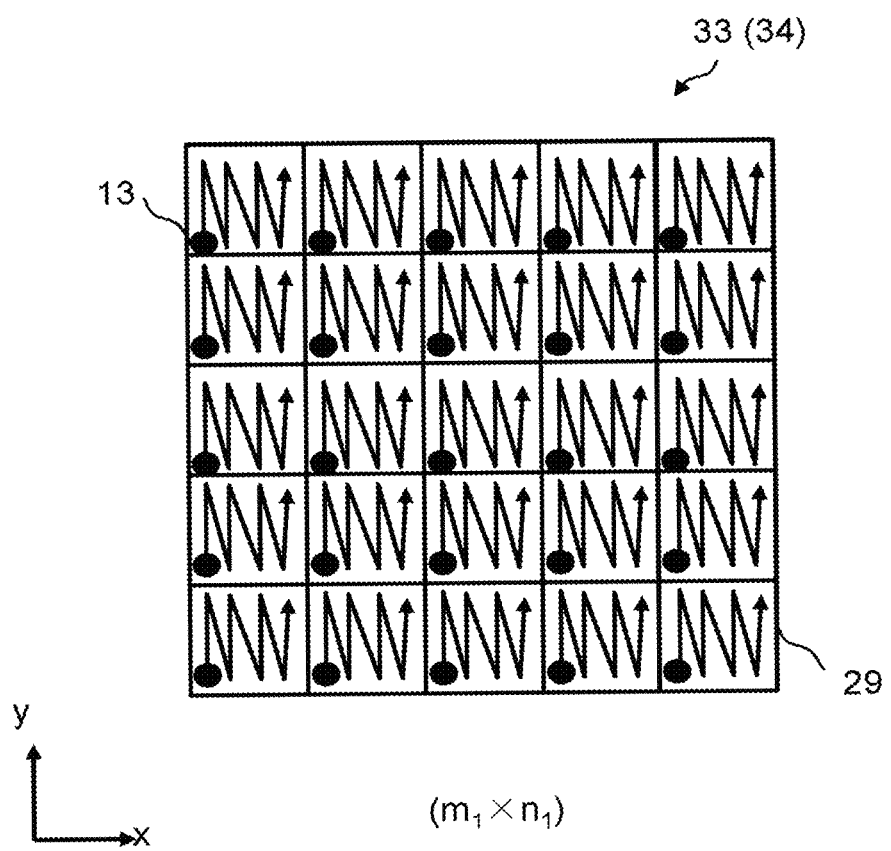
FIG. 4 illustrates a scanning operation with multiple beams according to the first embodiment.

FIG. 4 illustrates a scanning operation with multiple beams according to the first embodiment. FIG. 4 shows the case of multiple primary electron beams 20 of 5 rows×5 columns (5 rows by 5 columns). The size of an irradiation region 34 that can be irradiated by one irradiation with the multiple primary electron beams 20 is defined by (x direction size obtained by multiplying a pitch between beams in the x direction of the multiple primary electron beams 20 on the substrate 101 by the number of beams in the x direction)×(y direction size obtained by multiplying a pitch between beams in the y direction of the multiple primary electron beams 20 on the substrate 101 by the number of beams in the y direction). Preferably, the width of each stripe region 32 is set to be the same as the size in the y direction of the irradiation region 34, or to be the size reduced by the width of the scanning margin. In the case of FIGS. 3 and 4, the irradiation region 34 and the unit block 33 are of the same size. However, it is not limited thereto. The irradiation region 34 may be smaller than the unit block 33, or larger than it. Each beam of the multiple primary electron beams 20 scans a sub-irradiation region 29 surrounded by the pitch between the beams in the x direction and the pitch between the beams in the y direction such that the beam itself is located therein. Each beam 13 of the multiple primary electron beams 20 is associated with any one of the sub-irradiation regions 29 which are different from each other. At the time of each shot, each beam 13 is applied to the same position in the associated sub-irradiation region 29. The beam 13 is moved in the sub-irradiation region 29 by collective deflection of all the multiple primary electron beams 20 by the sub deflector 209. By repeating this operation, the inside of one sub-irradiation region 29 is irradiated with one beam in order. When scanning one sub-irradiation region 29 is completed, the irradiation position is moved to an adjacent unit block 33 in the same stripe region 32 by collectively deflecting all the multiple primary electron beams 20 by the main deflector 208. By repeating this operation, the inside of the stripe region 32 is irradiated in order. After completing scanning one stripe region 32, the irradiation position is moved to the next stripe region 32 by moving the stage 105 and/or by collectively deflecting all the multiple primary electron beams 20 by the main deflector 208. As described above, a secondary electron image of the unit block 33, a secondary electron image of the stripe region 32, or a secondary electron image of the chip 332 is configured by combining images (partial secondary electron images) each of which is an image of a sub-irradiation region 29 obtained by irradiation with a corresponding primary electron beam 13$i$ of the multiple primary electron beams 20.

It is also preferable to group, for example, a plurality of chips 332 arranged in the x direction as one group, and to divide each group into a plurality of stripe regions 32 by a predetermined width in the y direction, for example. Then, moving between the stripe regions may be performed not only for each chip 332 but also for each group.

In the case of the substrate 101 being irradiated with the multiple primary electron beams 20 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, in the case of scanning the sub-irradiation region 29, the emission position of each secondary electron beam changes every second inside the sub-irradiation region 29. Thus, the deflector 218 collectively deflects the multiple secondary electron beams 300 so that each secondary electron beam whose emission position has changed may be applied to a corresponding detection region of the multi-detector 222.

Figure 5:
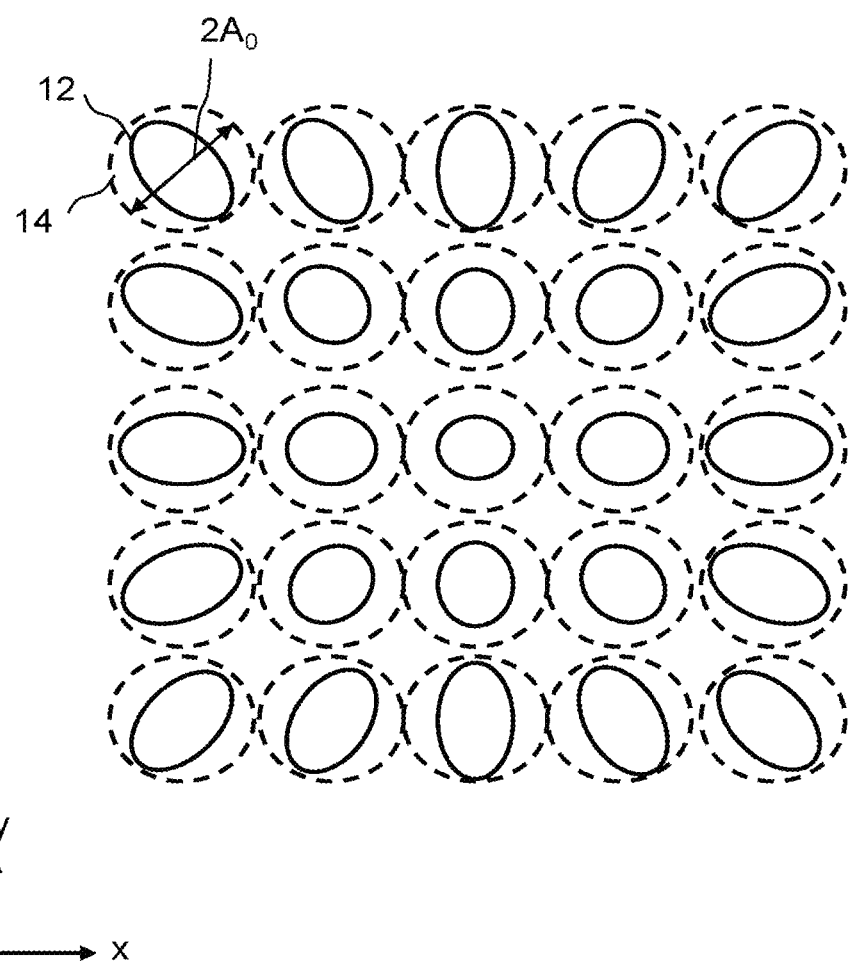
FIG. 5 shows an example of the shape and size of each of multiple primary electron beams according to the first embodiment.

FIG. 5 shows an example of the shape and size of each of multiple primary electron beams according to the first embodiment. FIG. 5 shows the case of multiple primary electron beams 20 of 5×5 (rows by columns). It is ideally desirable for the shape and size of a beam 12 on the substrate 101 which is a primary electron beam 13i of the multiple primary electron beams 20 to be uniform. However, actually, it is difficult to form uniform beams due to a manufacturing error of each hole 22 of the shaping aperture array substrate 203 and/or an aberration of the optical system, etc. In the case of FIG. 5, with respect to the multiple primary electron beams 20, in proportion as the beam 12 is far from the center, its shape becomes flat and elliptical and length of the long diameter increases compared to the center beam. The center beam is not necessarily a true circle. The shape and size of each primary electron beam 13i are not limited to the ones in the example of FIG. 5. They may be deformed to be other shape and/or size. Thus, secondary electron images obtained by irradiation with a plurality of primary electron beams having different shape and size including the direction on the substrate 101 are naturally affected by the different beam shape and size. As will be described later, in the first embodiment, secondary electron images obtained by irradiation with different primary electron beams are compared with each other. However, when secondary electron images having been affected by different shape and size of beams are compared, since deviation occurs between the images, they do not become the same as each other, thereby generating false (pseudo) defects. Therefore, it becomes difficult to perform a highly accurate inspection. Then, according to the first embodiment, all the primary electron beams are adjusted to be uniform beams 14 being true circles and having the size greater than or equal to the most deformed primary electron beam 13i. In other words, each secondary electron image obtained by irradiation with each primary electron beam 13i is processed to be close to the image in each sub-irradiation region 29 which may be obtained when scanning, with the true-circled uniform beam 14, the sub-irradiation region 29 associated with each primary electron beam. Furthermore, in other words, smoothing processing is performed such that the image in each sub-irradiation region 29 is blurred to be adjusted to an image obtained by irradiation with the most blurred primary electron beam. It will be specifically described.

Figure 6:
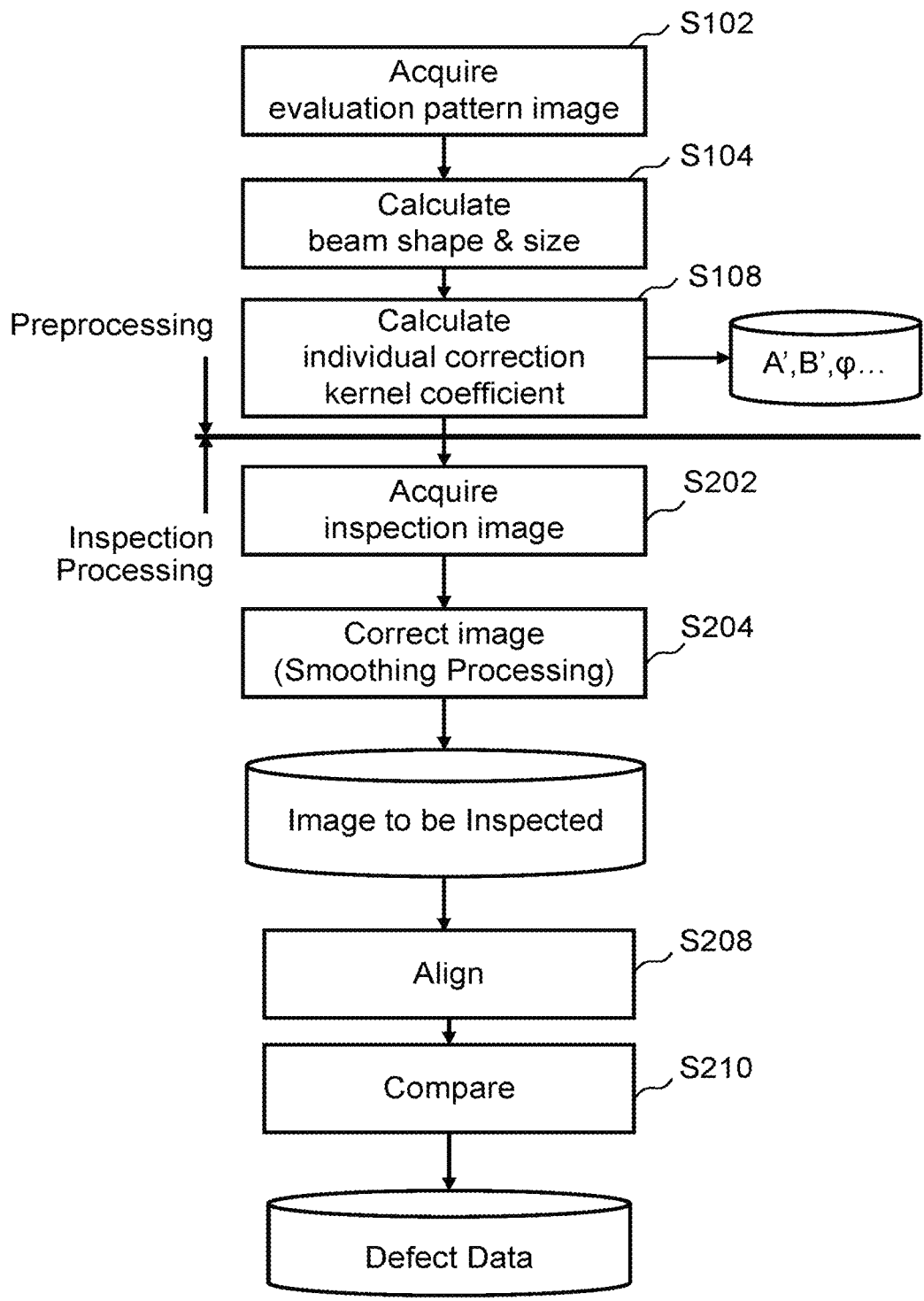
FIG. 6 is a flowchart showing main steps of an inspection method according to the first embodiment.

FIG. 6 is a flowchart showing main steps of an inspection method according to the first embodiment. In FIG. 6, the inspection method of the first embodiment executes a series of steps: an evaluation pattern image acquisition step (S102), a beam shape and size calculation step (S104), an individual correction kernel coefficient calculation step (S108), an inspection image acquisition step (S202), an image correction (smoothing processing) step (S204), an alignment step (S208), and a comparison step (S210).

In the evaluation pattern image acquisition step (S102), the image acquisition mechanism 150 (secondary electron image acquisition mechanism) scans the evaluation substrate, on which an evaluation pattern has been formed, with the multiple primary electron beams 20, and acquires an evaluation pattern image of each sub-irradiation region 29 which is individually scanned by a corresponding primary electron beam 13i. First, an image of the evaluation pattern is acquired using each primary electron beam 13i in order to acquire the shape and size of each primary electron beam 13i.

Figure 7:
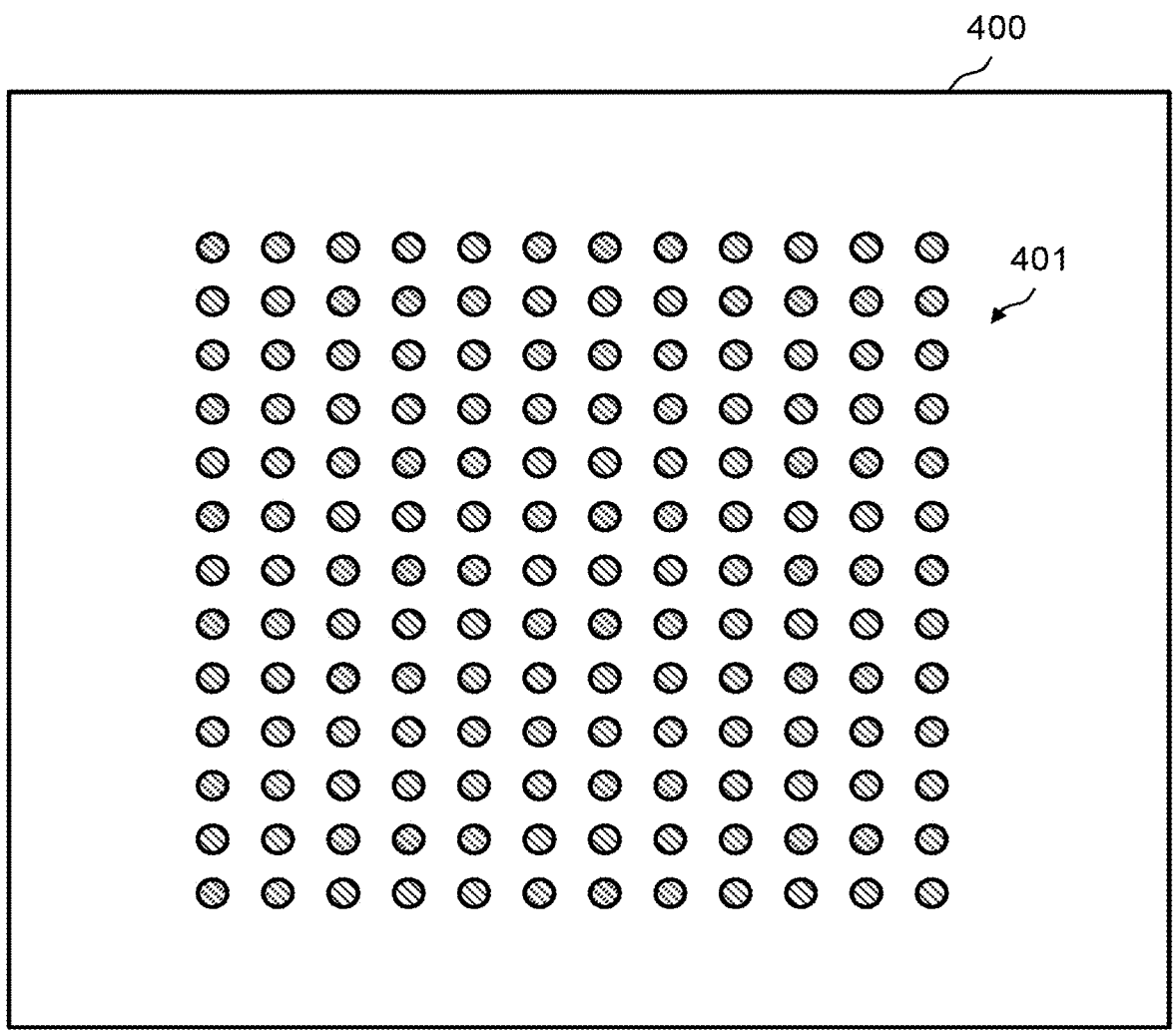
FIG. 7 shows an example of an evaluation pattern according to the first embodiment.

FIG. 7 shows an example of an evaluation pattern according to the first embodiment. As shown in FIG. 7, on an evaluation substrate 400, there is formed an evaluation pattern 401 in which dot patterns of the same true circles having the same size are formed in an array arrangement at a predetermined pitch. It is preferable to form the evaluation pattern 401 with the size and pitch to include some to some tens of dot patterns in each sub-irradiation region 29 scanned by a corresponding primary electron beam 13i. However, it is not limited thereto. It is also preferable that the evaluation pattern 401 is formed with the size and pitch to include one dot pattern in each sub-irradiation region 29. By obtaining an image of a true circular dot pattern, edge profiles in various directions can be extracted. Therefore, the orientation dependence on beam spread (divergence) can be comprehended.

Figure 8:
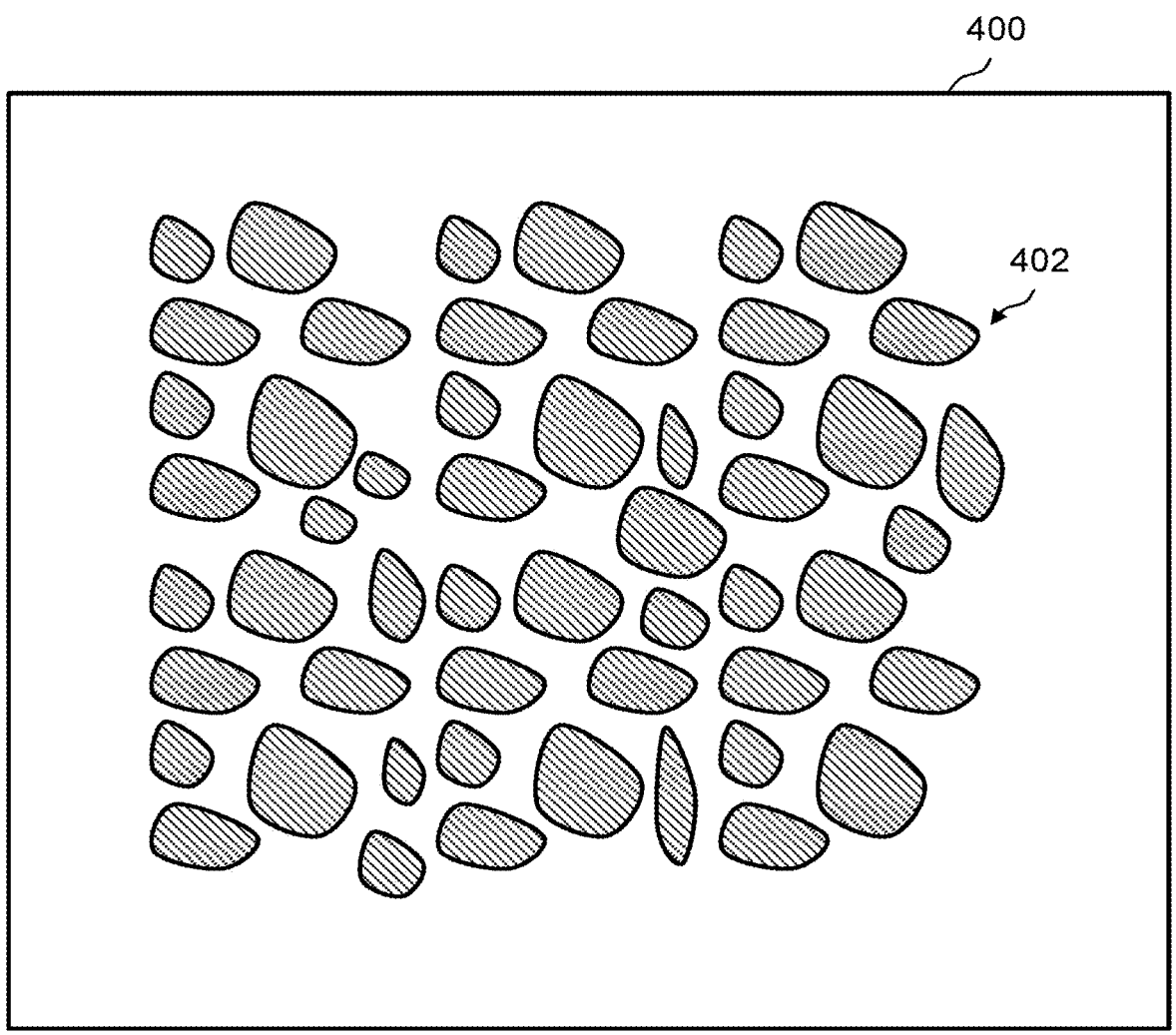
FIG. 8 shows another example of an evaluation pattern according to the first embodiment.

FIG. 8 shows another example of an evaluation pattern according to the first embodiment. The evaluation pattern is not limited to be composed of uniform dot patterns. FIG. 8 shows the case where an evaluation pattern 402 composed of a plurality of gold nanoparticles having random shapes and sizes is formed on the evaluation substrate 400. It is preferable to form the evaluation pattern 402 with the size to include some to some tens of gold nanoparticles in each sub-irradiation region 29 scanned by a corresponding primary electron beam 13i. However, it is not limited thereto. It is also preferable that the evaluation pattern 402 is formed with the size to include one gold nanoparticle in each sub-irradiation region 29. Even if there is size dependence on beam spread (divergence), the dependence can be eliminated by making the shape and size random.

Figure 9:
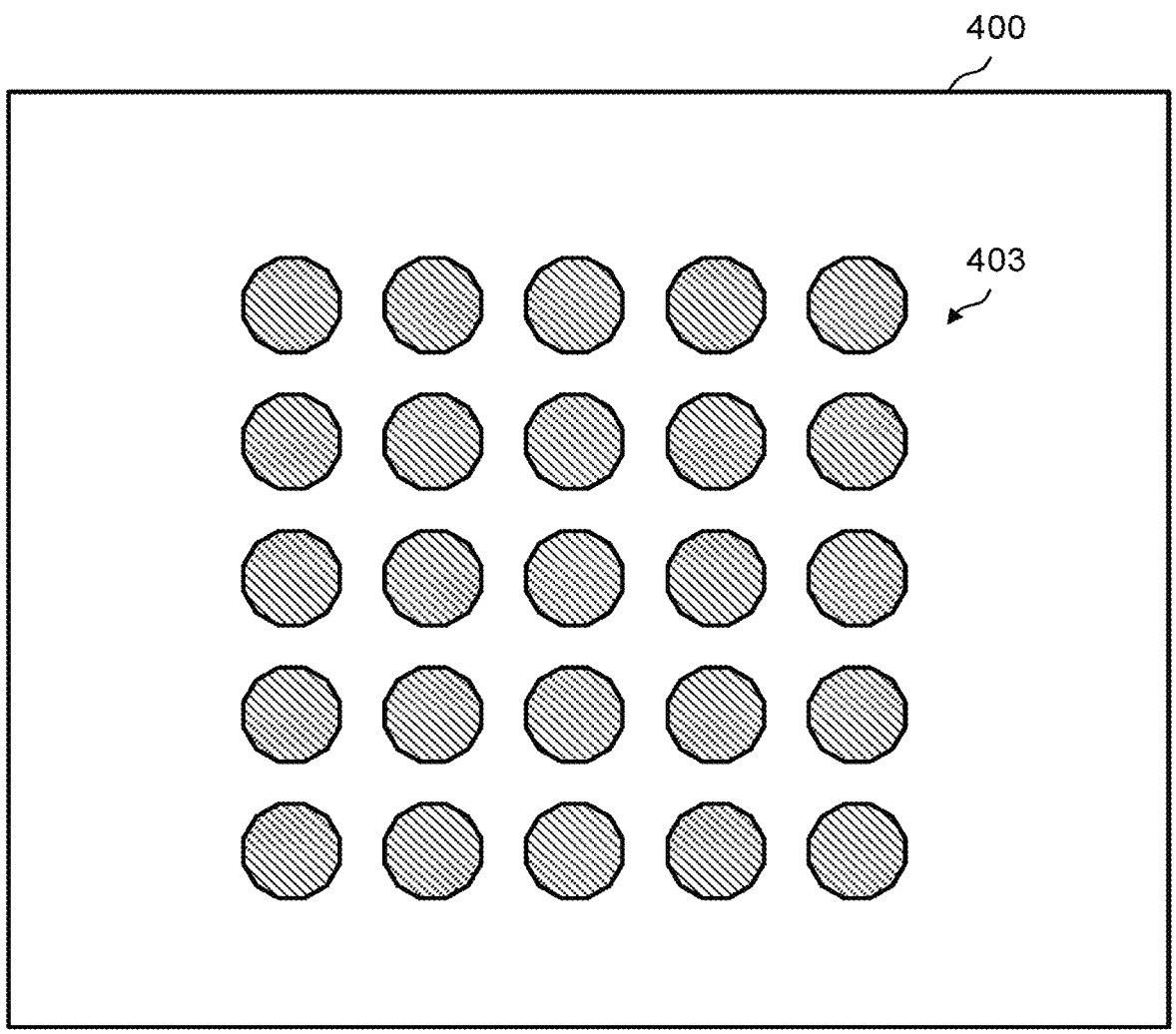
FIG. 9 shows another example of an evaluation pattern according to the first embodiment.

FIG. 9 shows another example of an evaluation pattern according to the first embodiment. As will be described later, a beam intensity profile, for example, at each of points on an outline (contour line) in twelve directions at every 30° along the outline (contour line) of each figure of the evaluation pattern is approximated. Therefore, FIG. 9 shows the case where, on the evaluation substrate 400, there is formed an evaluation pattern 403 in which regular dodecagonal dot patterns having the same size are formed in an array arrangement at a predetermined pitch. It is preferable to form the evaluation pattern 403 with the size and pitch to include some to some tens of dot patterns in each sub-irradiation region 29 scanned by a corresponding primary electron beam 13i. However, it is not limited thereto. It is also preferable that the evaluation pattern 403 is formed with the size and pitch to include one dot pattern in each sub-irradiation region 29.

According to the first embodiment, the multiple primary electron beams 20 may be collectively applied to the evaluation substrate 400 because there is no need of applying them one by one. Needless to say, it is also preferable to restrict and apply each beam one by one. For acquiring an image, as described above, the multiple primary electron beams 20 are applied to the evaluation substrate 400 so that the multi-detector 222 may detect the multiple secondary electron beams 300, including reflected electrons, emitted from the evaluation substrate 400 by the irradiation with the multiple primary electron beams 20, and thus, a secondary electron image of each sub-irradiation region 29 is acquired. Reflected electrons and secondary electrons may be projected on the multi-detector 222, or alternatively, after reflected electrons having been emitted along the way, only remaining secondary electrons may be projected thereon. Detected data (evaluation pattern measured image: secondary electron image: evaluation pattern image) on a secondary electron detected by the multi-detector 222 is output to the detection circuit 106 in order of measurement. In the detection circuit 106, the detected data in analog form is converted into digital data by an A-D converter (not shown), and stored in the chip pattern memory 123. In this way, the image acquisition mechanism 150 acquires a measured image of an evaluation pattern formed on the evaluation substrate. Then, the acquired measured image data is transmitted to the beam shape and size calculation circuit 129, together with information on each position from the position circuit 107.

In the beam shape and size calculation step (S104), the beam shape and size calculation circuit 129 (beam shape and size calculation unit) calculates, using a measured image of an evaluation pattern, the shape and size of each beam on the substrate 101 (or the evaluation substrate 400) which is each primary electron beam 13$i$ of the multiple primary electron beams 20. The method of acquiring (calculating or measuring) the beam shape and size of each primary electron beam 13$i$ is not limited. There are some products which provide a tool for measuring the shape of a beam, and for example, BEAMETR by aBeam Technologies. Further, there is a method being studied which estimates the shape of a beam, based on the principle of Blind-deconvolution. Any of the methods may be used. In the first embodiment, using the evaluation pattern image of the sub-irradiation region 29 of each primary electron beam 13$i$, a parameter indicating the beam shape and size is obtained by measuring an image blurring degree difference depending on the edge direction of a figure pattern in the image. A method for acquiring the beam shape and size of each primary electron beam 13$i$ will be specifically described. Assuming that the beam shape of the primary electron beam 13$i$ on the substrate 101 (or the evaluation substrate 400) is an ellipse, and using a secondary electron image of the evaluation pattern 401 (402 or 403) obtained by irradiation with the primary electron beam 13$i$, the beam shape and size calculation circuit 129 calculates a beam radius A in the long axis direction of the ellipse, a beam radius B in the short axis direction of the ellipse, and an angle φ0 in the long axis direction of the ellipse, for each primary electron beam 13$i$ of the multiple primary electron beams 20. A specific operation will be described.

Figure 10:
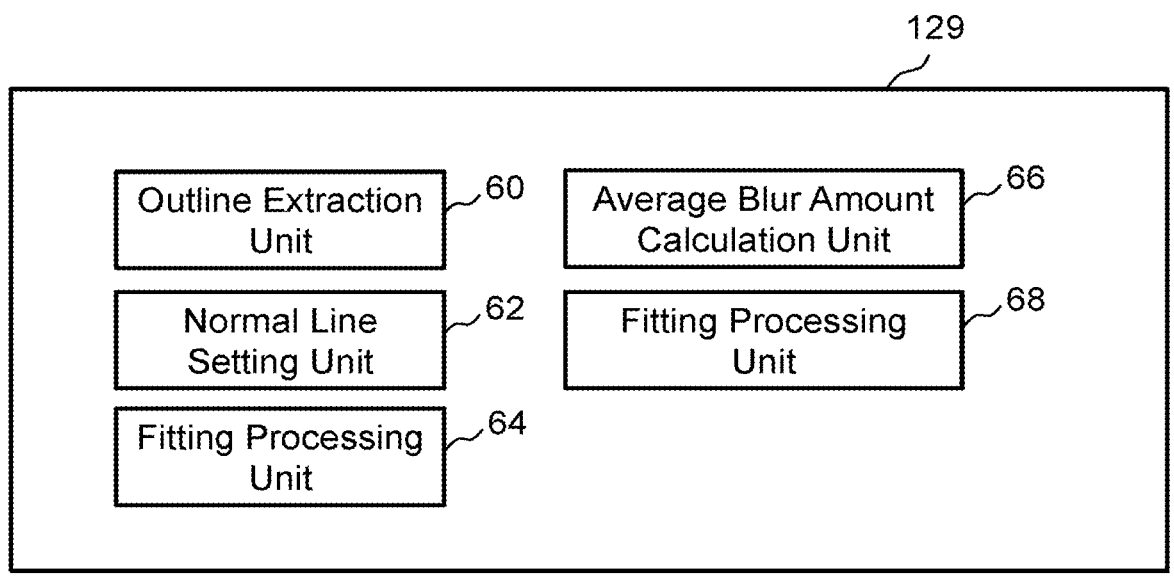
FIG. 10 is a block diagram showing an example of a configuration of a beam shape and size calculation circuit according to the first embodiment.

FIG. 10 is a block diagram showing an example of a configuration of a beam shape and size calculation circuit according to the first embodiment. As shown in FIG. 10, in the beam shape and size calculation circuit 129, there are disposed an outline extraction unit 60, a normal line setting unit 62, a fitting processing unit 64, an average blur amount calculation unit 66, and a fitting processing unit 68. Each of the "units" such as the outline extraction unit 60, the normal line setting unit 62, the fitting processing unit 64, the average blur amount calculation unit 66, and the fitting processing unit 68 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the outline extraction unit 60, the normal line setting unit 62, the fitting processing unit 64, the average blur amount calculation unit 66, and the fitting processing unit 68, and calculated results are stored in a memory (not shown) or in the memory 118 each time.

First, in an outline extraction step, with respect to evaluation pattern images (a plurality of partial images) of a plurality of sub-irradiation regions 29 in the irradiation region 34, each of the evaluation pattern images being obtained by irradiation with a corresponding primary electron beam 13$i$, where the evaluation pattern images configure a secondary electron image of the irradiation region 34 acquired by irradiation with the multiple primary electron beams 20, the outline extraction unit 60 extracts the outline of each figure pattern in the evaluation pattern image of a sub-irradiation region 29, for each evaluation pattern image (partial image) of a sub-irradiation region 29 of a primary electron beam 13$i$.

Next, in a normal line setting step, the normal line setting unit 62 sets, for each extracted figure pattern in the evaluation pattern image of the sub-irradiation region 29 of each primary electron beam 13$i$, a normal line (cutting line) perpendicular to the outline, for every predetermined number of pixels, along the outline of the figure pattern.

Figure 11:
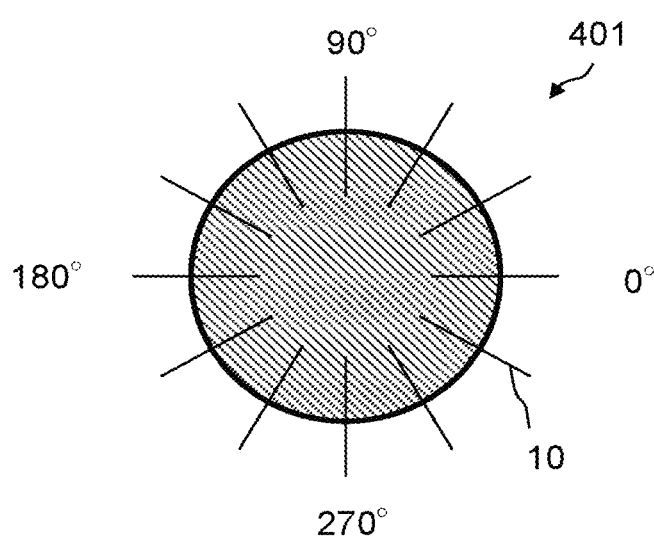
FIG. 11 shows an example of a figure pattern with normal lines along its outline, according to the first embodiment.

FIG. 11 shows an example of a figure pattern with normal lines along its outline, according to the first embodiment. FIG. 11 shows the case where a normal 10 is set at every 30° along the outline of a circular dot pattern in the evaluation pattern 401. While the normal 10 is drawn at every 30° in the example of FIG. 11, it is preferable to draw more normals 10.

Figure 12:
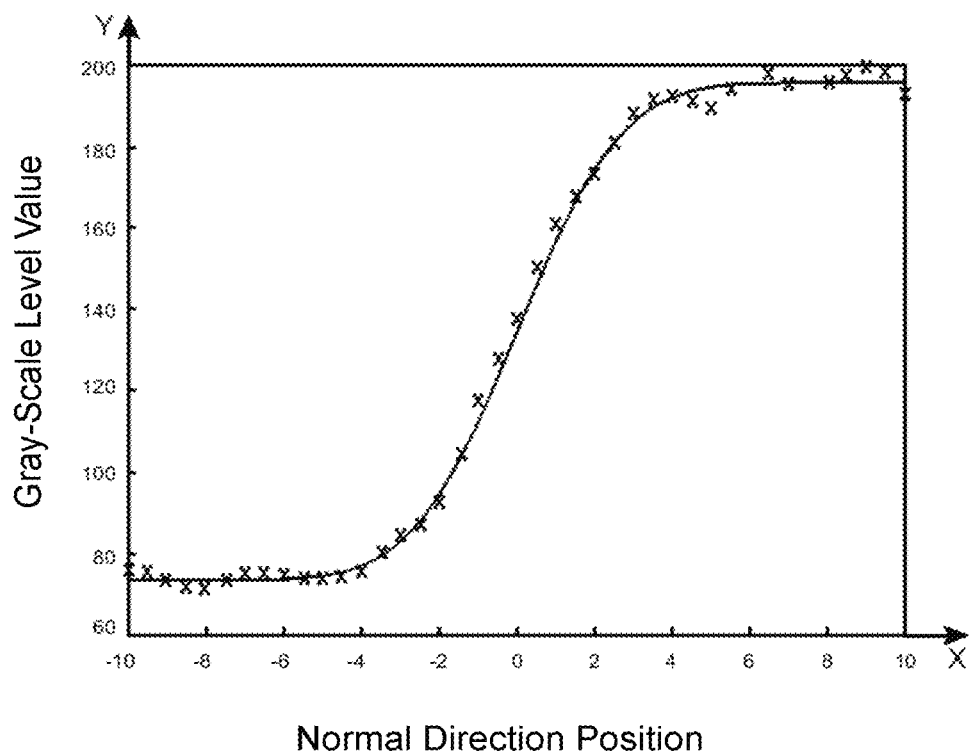
FIG. 12 shows an example of a signal profile on a normal line according to the first embodiment.

FIG. 12 shows an example of a signal profile on a normal line according to the first embodiment. In FIG. 12, the ordinate axis y represents a gray-scale level value and the abscissa axis x represents the position of each pixel on the normal 10. Preferably, for example, each pixel of an evaluation pattern image is set to be a grid-like form of around the same size as that of the primary electron beam 13$i$. When plotting a gray-scale level value of each pixel on the normal 10, a signal profile as shown in the example of FIG. 12 is formed. The signal profile can be approximated by an error function. The error function is defined by the following equation (1-1) using an integration variable t.

$$\operatorname{erf}(x) = \frac{2}{\sqrt{\pi}} \int_0^x e^{-t^2} \, dt \qquad (1\text{-}1)$$

Then, in a signal profile fitting step, the fitting processing unit 64 obtains parameters a, b, x0, and σ by performing approximation (fitting) of the gray-scale level value of each pixel on the normal 10 by the error function shown in the following equation (1-2), for each normal 10 of each figure pattern in the evaluation pattern image of the sub-irradiation region 29 of each primary electron beam 13$i$.

$$y = \frac{(a-b)}{2} \operatorname{erf}\left(\frac{x-x_0}{\sqrt{2}\,\sigma}\right) + \frac{a+b}{2} \qquad (1\text{-}2)$$

Next, in an average blur amount calculating step, the average blur amount calculation unit 66 divides each of all figure patterns in the evaluation pattern image of the sub-irradiation region 29 associated with each primary electron beam 13i into, for example, groups of twelve orientations by 30° depending on the orientation (direction) of the normal 10. For example, each figure pattern is divided into twelve groups as follows: The normal 10 of from 0° to below 30° belongs to the orientation group 1, the normal 10 of from 30° to below 60° belongs to the orientation group 2, the normal 10 of from 60° to below 90° belongs to the orientation group 3, the normal 10 of from 90° to below 120° belongs to the orientation group 4, the normal 10 of from 120° to below 150° belongs to the orientation group 5, the normal 10 of from 150° to below 180° belongs to the orientation group 6, the normal 10 of from 180° to below 210° belongs to the orientation group 7, the normal 10 of from 210° to below 240° belongs to the orientation group 8, the normal 10 of from 240° to below 270° belongs to the orientation group 9, the normal 10 of from 270° to below 300° belongs to the orientation group 10, the normal 10 of from 300° to below 330° belongs to the orientation group 11, and the normal 10 of from 330° to below 360° belongs to the orientation group 12. Then, the average blur amount calculation unit 66 calculates an average of the parameter σ obtained with respect to the signal profile of each normal 10, for each evaluation pattern image (partial image) of the sub-irradiation region 29 of each primary electron beam 13i and for each orientation group. Here, the value of (√2) σ is used as an index representing a blur amount, for example. Therefore, by calculating an average value of the parameter o and multiplying it by (√2), an average blur amount (average of (√2)σ) can be obtained for each group.

Figure 13:
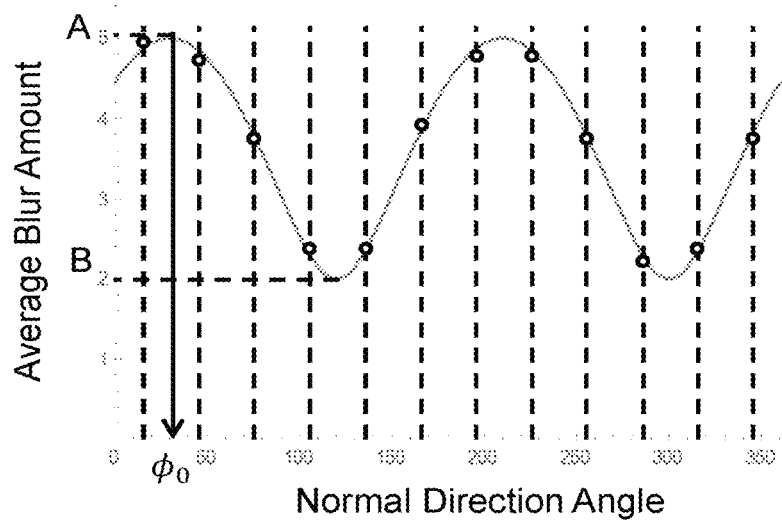
FIG. 13 shows an example of relation between a normal direction and an average blur amount according to the first embodiment.

FIG. 13 shows an example of relation between a normal direction and an average blur amount according to the first embodiment. In FIG. 13, the ordinate axis y represents an average blur amount, and the abscissa axis x represents a normal direction angle. The average blur amount obtained as described above is indicated by a plotted black dot. As shown in the example of FIG. 13, the correspondence relation between the normal direction and the average blur amount can be approximated by a function such as the following equation (2).

In a fitting step, for each evaluation pattern image (partial image) of the sub-irradiation region 29 associated with each primary electron beam 13i, the fitting processing unit 68 calculates parameters A, B, and φ0 by approximating (fitting) the correspondence relation between the normal direction and the average blur amount by the function shown by the following equation (2), where A>B.

$$r(\phi) = \sqrt{A^2 \cos^2(\phi-\phi_0) + B^2 \sin^2(\phi-\phi_0)} \quad (2)$$

Figure 14:
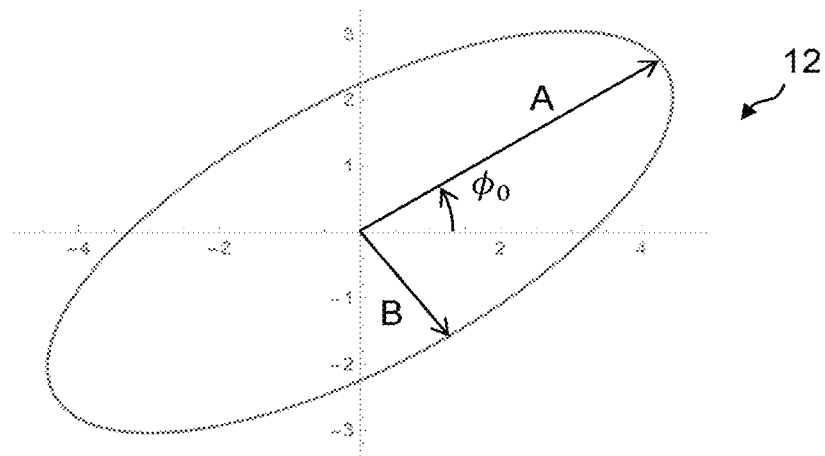
FIG. 14 shows an example of the shape and size of a primary electron beam of multiple primary electron beams according to the first embodiment.

FIG. 14 shows an example of the shape and size of a primary electron beam of multiple primary electron beams according to the first embodiment. As shown in FIG. 14, as a result of performing fitting by the equation (2), based on an assumption that the shape of each primary electron beam 13i on the substrate is an ellipse, the obtained parameter A indicates the beam radius in the long axis direction of the ellipse, the parameter B indicates the beam radius in the short axis direction of the ellipse, and the parameter φ0 indicates the angle in the long axis direction of the ellipse. By performing calculation processing described above on the evaluation pattern images of the sub-irradiation regions 29 associated with all the primary electron beams 13i, the parameters indicating the shape and size of an ellipse, such as the beam radius A in the long axis direction of the ellipse, the beam radius B in the short axis direction of the ellipse, and the angle φ0 in the long axis direction of the ellipse of each primary electron beam 13i on the substrate 101 (the evaluation substrate 400) can be obtained. The calculated parameters A, B, and φ0 of each primary electron beam 13i are output to the kernel coefficient calculation circuit 130.

In the individual correction kernel coefficient calculation step (S108), the kernel coefficient calculation circuit 130 calculates a coefficient of kernel Ki for individual correction (that is a function for individual correction) of each primary electron beam 13i in order to correct an image of the sub-irradiation region 29 associated with each primary electron beam 13i. The coefficient of the kernel Ki for individual correction of each primary electron beam 13i is acquired using a secondary electron image of an evaluation pattern which is obtained by irradiation with each primary electron beam 13i of the multiple primary electron beams 20.

Figure 15:
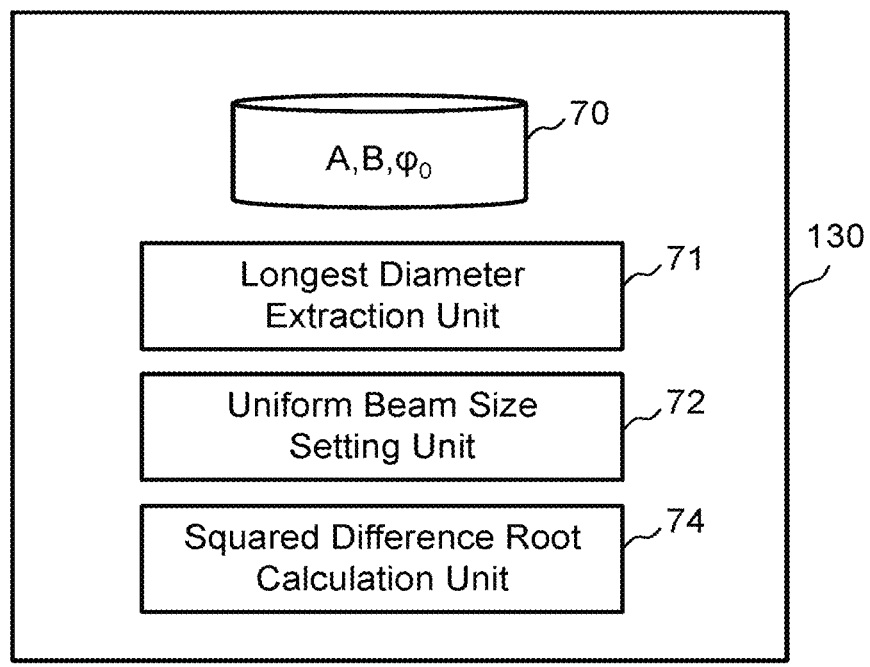
FIG. 15 is a block diagram showing an example of a configuration of a kernel coefficient calculation circuit according to the first embodiment.

FIG. 15 is a block diagram showing an example of the configuration of a kernel coefficient calculation circuit according to the first embodiment. As shown in FIG. 15, in the kernel coefficient calculation circuit 130, there are arranged a storage device 70, such as a magnetic disk drive, a longest diameter extraction unit 71, a uniform beam size setting unit 72, and a squared difference root calculation unit 74. Each of the "units" such as the longest diameter extraction unit 71, the uniform beam size setting unit 72, and the squared difference root calculation unit 74 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the longest diameter extraction unit 71, the uniform beam size setting unit 72, and the squared difference root calculation unit 74, and calculated results are stored in a memory (not shown) or in the memory 118 each time.

First, the parameters A, B and φ0 of each primary electron beam 13i which have been input to the kernel coefficient calculation circuit 130 are stored in the storage device 70 to be corresponding to/associated with each primary electron beam 13i.

Next, in a longest diameter extraction step, the longest diameter extraction unit 71 (extraction unit) reads the parameter A from the storage device 70, and extracts the maximum beam radius Amax in the long axis direction from all the beam shapes of the multiple primary electron beams 20 on the substrate 101 (evaluation substrate 400). In the case of FIG. 5, the beam 12 farthest from the center beam is formed with the maximum beam radius Amax. Therefore, the longest diameter extraction unit 71 extracts the beam radius A in the long axis direction of the beam 12 farthest from the center beam, as the maximum beam radius Amax.

In a uniform beam size setting step, the uniform beam size setting unit 72 sets a predetermined size (beam radius A0) greater than or equal to the maximum size (the maximum beam radius Amax in the long axis direction) of each beam size (the beam radius A in the long axis direction) of the multiple primary electron beams 20. In the case of FIG. 5, the true circle beam of the beam 12 farthest from the center beam, which has the beam radius A0 (diameter 2A0) a little larger than the maximum beam radius Amax, is shown as the uniform beam 14.

In a squared difference root calculation step, the squared difference root calculation unit 74 calculates a squared root A' of a squared difference between the size (beam radius A) of each primary electron beam 13i and the size (beam radius A0) of the true circle uniform beam 14, and a squared root B' of a squared difference between the size (beam radius B) of each primary electron beam 13i and the size (beam radius A0) as shown by the following equations (3-1) and (3-2).

$$A' = \sqrt{A_0^2 - A^2} \quad (3\text{-}1)$$

$$B' = \sqrt{A_0^2 - B^2} \quad (3\text{-}2)$$

The individual correction kernel Ki of each primary electron beam 13i can be defined by the following equation (4) of elliptical Gaussian distribution.

$$Ki(x, y) = \frac{1}{2\pi A'B'} \exp\left(-\frac{1}{2}\left(\frac{(x\cos\varphi_0 + y\sin\varphi_0)^2}{A'^2} + \frac{(-x\sin\varphi_0 + y\cos\varphi_0)^2}{B'^2}\right)\right) \quad (4)$$

The kernel Ki shown in the equation (4) for individual correction of each primary electron beam 13i is a kernel for correcting an image (partial secondary electron image) of the sub-irradiation region 29 of the primary electron beam 13i so that the image may be close to a uniform beam partial image acquired by irradiating the sub-irradiation region 29 of the target primary electron beam 13i with the uniform beam 14 (true circle beam having the beam radius A0) obtained by equalizing the beam shapes and sizes of all the primary electron beams 13i. Specifically, the kernel Ki for individual correction is a kernel for correcting a partial secondary electron image of the sub irradiation region 20 of the primary electron beam 13i such that the difference between a predetermined beam radius A0, being greater than or equal to the maximum beam radius Amax, and a beam radius A in the long axis direction of the primary electron beam 13i, and the difference between the predetermined beam radius A0 and a beam radius B in the short axis direction are compensated. By calculating as described above, coefficients A', B', and φ0 of the kernel Ki for individual correction of each primary electron beam 13i can be acquired. Information on the acquired coefficients A', B', and φ0 of the kernel Ki for individual correction of each primary electron beam 13i are output to the correction circuit 113.

Actual inspection processing is carried out after completing the preprocessing described above.

In the inspection image acquisition step (S202), the image acquisition mechanism 150 acquires a secondary electron image(s) of a plurality of figure patterns by applying the multiple primary electron beams 20 to the substrate 101 where a plurality of figure patterns are formed, and detecting the multiple secondary electron beams 300 emitted from the substrate 101 by the irradiation with the multiple primary electron beams 20. As described above, reflected electrons and secondary electrons may be projected on the multi-detector 222, or alternatively, after reflected electrons having been emitted along the way, only remaining secondary electrons may be projected thereon. Specifically, it operates as follows: As mentioned above, the image acquisition mechanism 150 scans the stripe region 32 in order to acquire an image of the stripe region 32. For acquiring an image, as described above, the multiple primary electron beams 20 are applied to the substrate 101 so that the multi-detector 222 may detect the multiple secondary electron beams 300, including reflected electrons, emitted from the substrate 101 by the irradiation with the multiple primary electron beams 20. Detected data (measured image: secondary electron image: image to be inspected) on a secondary electron detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed in each stripe region 32. Then, the acquired measured image data is transmitted to the correction circuit 113, together with information on each position from the position circuit 107.

In the image correction (smoothing processing) step (S204), the correction circuit 113 (correction unit) performs correction processing on measured images (partial secondary electron images) of a plurality of sub-irradiation regions 29 each obtained by irradiation with a corresponding primary electron beam 13i, where the measured images configure a secondary electron image of the unit block 33 or the stripe region 32. For each measured image of the sub-irradiation region 29, the correction circuit 113 corrects, using the kernel Ki for individual correction of each primary electron beam 13i, a measured image of the sub-irradiation region 29 so that the image may be close to a uniform beam partial image acquired by irradiating the sub-irradiation region 29 of the target primary electron beam 131 corresponding to the measured image of the sub-irradiation region 29 with the above-described uniform beam 14 (true circle beam). The uniform beam 14 (true circle beam) is set as a uniform beam obtained by equalizing the beam shapes and sizes of all the primary electron beams 13i of the multiple primary electron beams 20. Specifically, for each primary electron beam 13i, the correction circuit 113 corrects, using the kernel Ki for individual correction of each primary electron beam 13i, the measured image (partial secondary electron image) of the sub-irradiation region 29 such that the difference between a predetermined beam radius A0, being greater than or equal to the maximum beam radius, and a beam radius A in the long axis direction of the primary electron beam 13i, and the difference between the predetermined beam radius A0 and a beam radius B in the short axis direction are compensated. Specifically, for an acquired image configured by signals obtained for each primary electron beam 131, the correction circuit 113 corrects the measured image (partial secondary electron image) of the sub-irradiation region 29 by performing convolution calculation processing using the kernel Ki for individual correction of each primary electron beam 13i such that the difference between a predetermined beam radius A0, being greater than or equal to the maximum beam radius, and a beam radius A in the long axis direction of the primary electron beam 13i, and the difference between the predetermined beam radius A0 and a beam radius B in the short axis direction are compensated. Although, in the above description, the function for processing the convolution calculation using the kernel for individual correction is used, it is also preferable, instead of the function for processing the convolution calculation, to use another function having an effect equivalent to that of the convolution operation.

Figure 16:
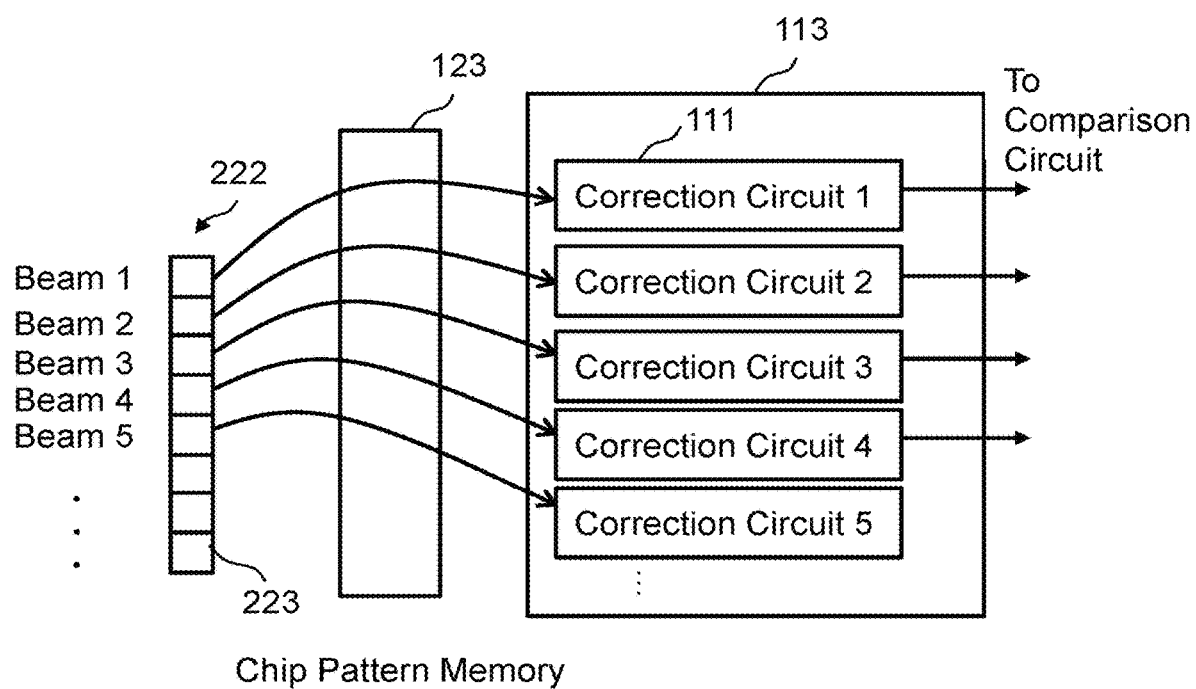
FIG. 16 illustrates a method for correcting an image according to the first embodiment.

FIG. 16 illustrates a method for correcting an image according to the first embodiment. In FIG. 16, sub correction circuits 111 (1, 2, 3, 4, 5, . . . ) whose number is greater than or equal to that of beams of the multiple primary electron beams 20 are disposed in the correction circuit 113. As described above, a plurality of sensors 223 are disposed in the multi-detector 222. Each sensor 223 is assigned such that it detects a secondary electron beam emitted by irradiation with anyone primary electron beam 13i of the multiple primary electron beams 20, where each primary electron beam corresponds to one of sensors 223 which is different from the others. Moreover, each sub correction circuit 111 in the correction circuit 113 is assigned to the sensor 223 such that each sub correction circuit 111 inputs image data from any one of a plurality of sensors 223 in the multi-detector 222, where each sensor 223 corresponds to one of sub correction circuits 111 which is different from the others. In other words, each sub correction circuit 111 in the correction circuit 113 is assigned to the sensor 223 for detecting a secondary electron beam emitted by irradiation with any one primary electron beam 13$i$ of the multiple primary electron beams 20. A coefficient of the individual correction kernel Ki for the associated primary electron beam 13$i$ is input to each sub correction circuit 111, and the individual correction kernel Ki shown by the equation (4) is set therein. In the case of FIG. 16, an output of the sensor 223 corresponding to the primary electron beam (beam 1) is input to the sub correction circuit 1. An output of the sensor 223 corresponding to the primary electron beam (beam 2) is input to the sub correction circuit 2. An output of the sensor 223 corresponding to the primary electron beam (beam 3) is input to the sub correction circuit 3. An output of the sensor 223 corresponding to the primary electron beam (beam 4) is input to the sub correction circuit 4. An output of the sensor 223 corresponding to the primary electron beam (beam 5) is input to the sub correction circuit 5. With respect to a measured image (partial secondary electron image) of the sub-irradiation region 29 of the associated primary electron beam 13$i$, each sub correction circuit performs smoothing processing by applying a convolution operation on the individual correction kernel Ki for the associated primary electron beam 13$i$. Thus, data of the measured image of each sub-irradiation region 29 for which smoothing processing has been performed is output to the comparison circuit 108, together with information on position information indicated by the position circuit 107.

Figure 17:
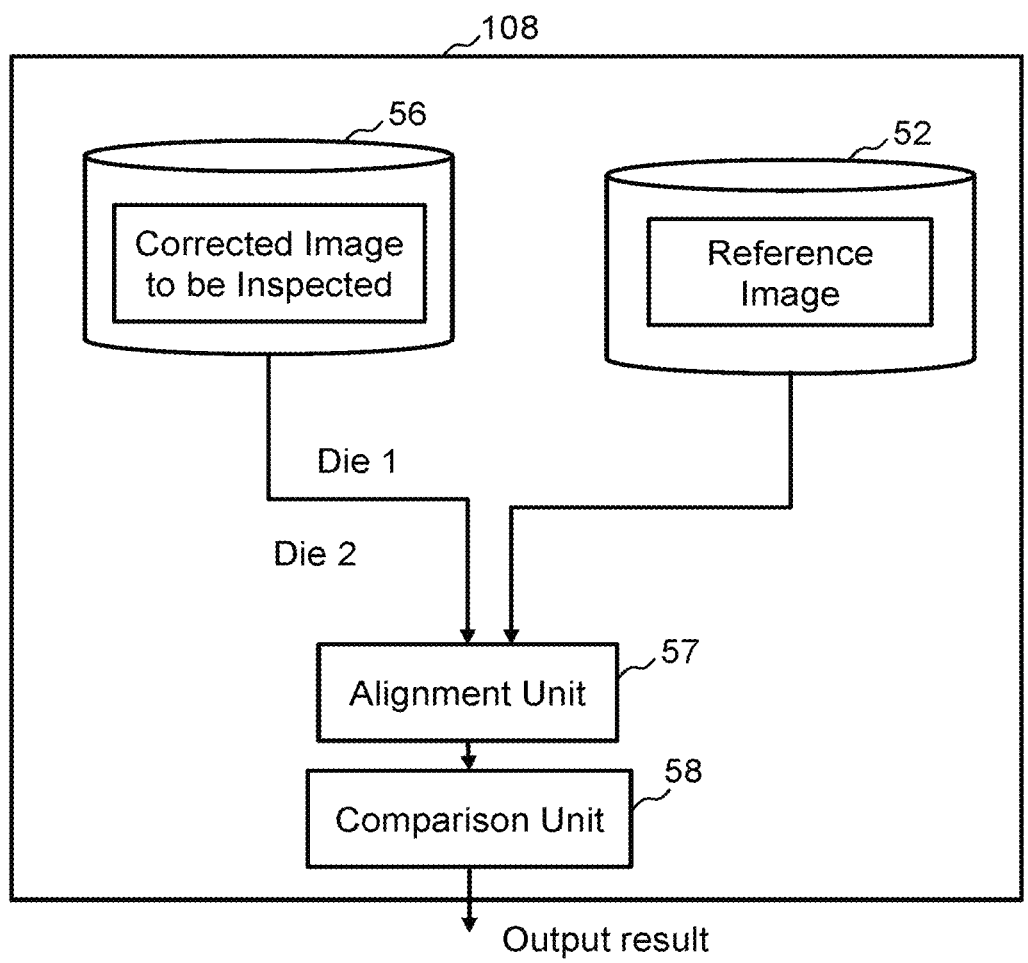
FIG. 17 shows an example of an internal configuration of a comparison circuit according to the first embodiment.

FIG. 17 shows an example of an internal configuration of a comparison circuit according to the first embodiment. In FIG. 17, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the alignment unit 57 and the comparison unit 58, and calculated results are stored in a memory (not shown) or in the memory 118 each time.

The comparison circuit 108 (inspection unit) performs inspection while using measured images (partial secondary electron images) of a plurality of sub-irradiation regions 29 for each of which correction processing has been performed. Here, the case of performing a die-to-die inspection will be mainly described.

Figure 18:
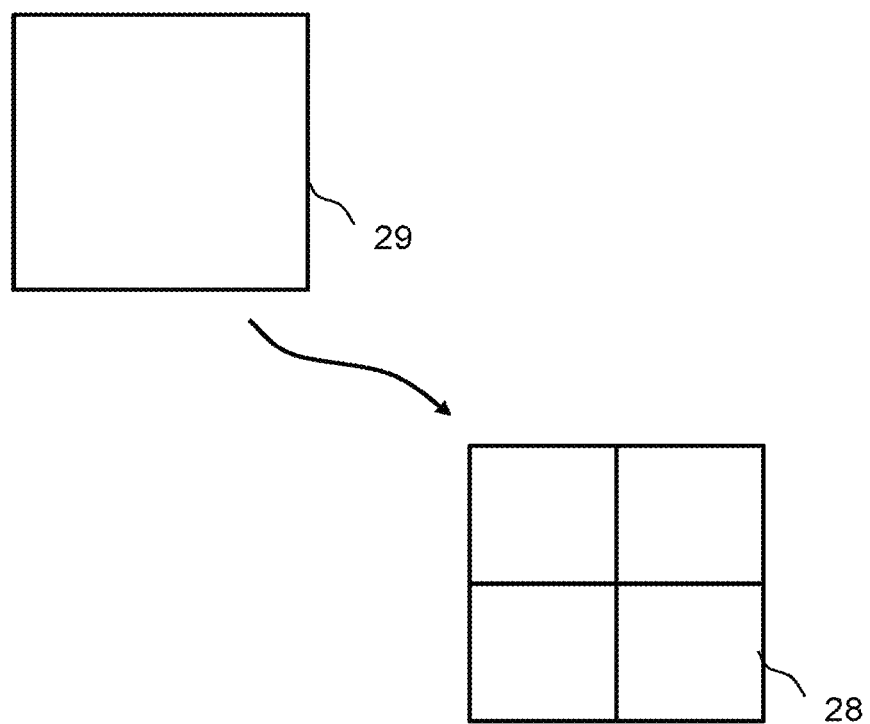
FIG. 18 shows an example of an image to be inspected according to the first embodiment.

FIG. 18 shows an example of an image to be inspected according to the first embodiment. In the first embodiment, the sub-irradiation region 29 acquired by a scanning operation of one primary electron beam 13$i$ is further divided into a plurality of mask die regions 28. The mask die region 28 is used as a unit region of an image to be inspected. FIG. 18 shows the case where the sub-irradiation region 29 is divided into four mask die regions 28. Therefore, when comparing inspection images of different sub irradiation regions 29, the primary electron beams 13$i$ used for the scanning operation are different from each other in many cases. According to the first embodiment, inspection images obtained with different primary electron beams 13$i$ can be compared with each other by making deviation between the images which is caused by a beam characteristic difference between the primary electron beams 13$i$ be close to uniform by smoothing processing. In order to prevent missing an image, it is preferable that the margin region of each mask die region 28 overlaps each other.

In the comparison circuit 108, transmitted pattern image data (secondary electron image data) is temporarily stored in the storage device 56, as a mask die image (corrected image to be inspected) of each mask die region 28.

In the alignment step (S208), the alignment unit 57 reads a mask die image (corrected image to be inspected) of the die 1 and a mask die image (corrected image to be inspected) of the die 2 on which the same pattern as that of the die 1 is formed, and provides alignment between both the images, based on units of sub-pixels smaller than units of pixels. For example, the alignment can be performed using a least-squares method. Preferably, the pixel size is set to be, for example, a region whose size is approximately the same as that of each beam of the multiple primary electron beams 20. Therefore, the sub-irradiation region 29 to be scanned by each beam is composed of n×n pixels. For example, it is composed of 16×16 pixels.

In the comparison step (S210), the comparison unit 58 compares the mask die image (corrected image to be inspected) of the die 1 with the mask die image (corrected image to be inspected) of the die 2. The comparison unit 58 compares them, for each pixel, based on predetermined determination conditions in order to determine whether there is a defect such as a shape defect. For example, if a gray scale level difference of each pixel is larger than a determination threshold Th, it is determined that there is a defect. Then, the comparison result is output to the storage device 109, the monitor 117, or the memory 118, or alternatively, output from the printer 119.

Figure 19A:
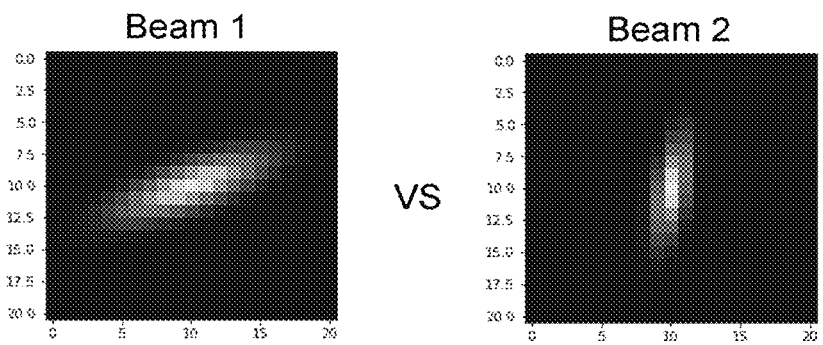
FIGS. 19A to 19D show an effect of image correction according to the first embodiment.
Figure 19B:
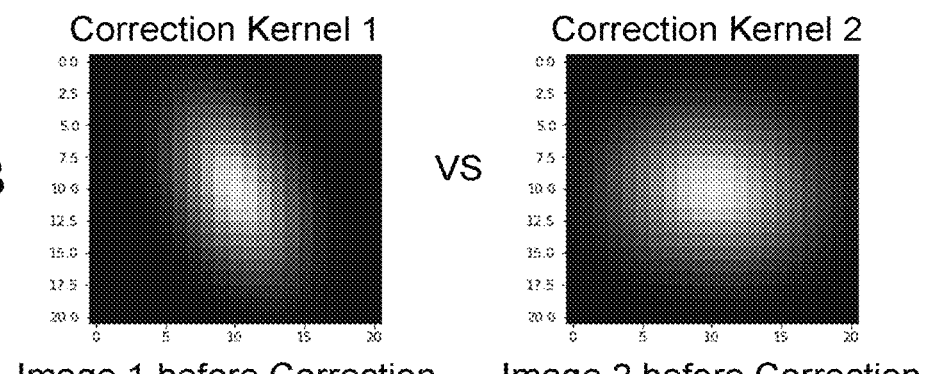
Figure 19C:
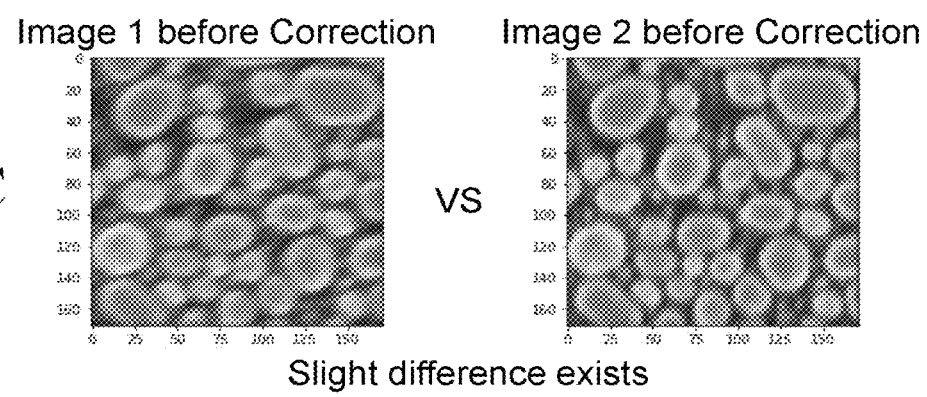
Figure 19D:
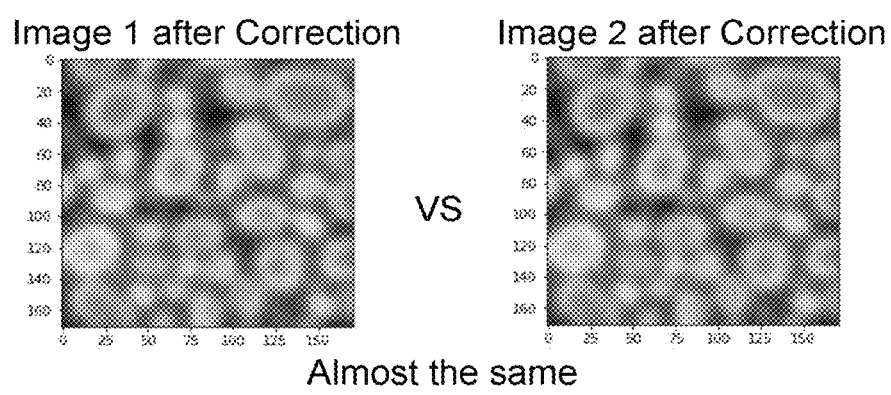

FIGS. 19A to 19D show an effect of image correction according to the first embodiment. FIG. 19A shows comparison of the shape and size between the beams 1 and 2 of the multiple primary electron beams 20. The beam 1 is an elliptical beam whose long axis direction is in the oblique lateral direction in FIG. 19A. On the other hand, the beam 2 is an elliptical beam whose long axis direction is in the up and down direction in FIG. 19A. FIG. 19C shows comparison between an image (image 1 before being corrected) acquired by irradiation with the beam 1, and an image (image 2 before being corrected) acquired by irradiation with the beam 2. In this case, images obtained by scanning the same evaluation pattern with the beams 1 and 2 are shown. Since the shapes and sizes of the beams 1 and 2 irradiating the substrate 101 are different from each other, there is a difference between the acquired images as shown in FIG. 19C. Then, according to the first embodiment, correction is performed such that the acquired images are adjusted to be images acquired by irradiation with a uniform beam being a true circle and having the maximum diameter size. FIG. 19B shows comparison between the beam shapes and sizes of the correction kernel 1 for the beam 1 and the correction kernel 2 for the beam 2. The shapes of the kernels have been set to be close to a uniform beam being a true circle and having the maximum diameter size. Calculation of convoluting the correction kernel 1 to the image acquired by irradiation with the beam 1 is performed, and calculation of convoluting the correction kernel 2 to the image acquired by irradiation with the beam 2 is performed. Thereby, as shown in FIG. 19D, it is possible to correct the image 1 of the beam 1 and the image 2 of the beam 2, which have been corrected, to be substantially the same images although blurring in both the images is increased.

According to the first embodiment, as described above, in multi-beam inspection, even if inspection images have been acquired by irradiation with different beams, it is possible to make them be close to images acquired under the same conditions. Therefore, inspection between images acquired by irradiation with different beams can be achieved.

In the example described above, the die-to-die inspection is performed. However, it is not limited thereto. The die-to-database inspection may be performed. When executing the die-to-database inspection, reference image data is temporarily stored in the storage device 52. A reference image is generated by the reference image generation circuit 112.

The reference image generation circuit 112 (reference image generation unit) generates a reference image corresponding to a mask die image, based on design data serving as a basis of a plurality of figure patterns formed on the substrate 101. Specifically, it operates as follows: First, design pattern data is read from the storage device 109 through the control computer 110, and each figure pattern defined in the read design pattern data is converted into image data of binary or multiple values.

As described above, basics of figures defined by the design pattern data are, for example, rectangles and triangles. For example, there is stored figure data defining the shape, size, position, and the like of each pattern figure by using information, such as coordinates (x,y) of the reference position of the figure, lengths of sides of the figure, and a figure code serving as an identifier for identifying the figure type such as rectangles, triangles and the like.

When design pattern data serving as the figure data is input to the reference image generation circuit 112, the data is developed into data of each figure. Then, the figure code, the figure dimensions, and the like indicating the figure shape of each figure data are interpreted. Then, the reference image generation circuit 112 develops each figure data to design pattern image data of binary or multiple values as a pattern to be arranged in a square in units of grids of predetermined quantization dimensions, and outputs the developed data. In other words, the reference image generation circuit 112 reads design data, calculates an occupancy rate occupied by a figure in the design pattern, for each square region obtained by virtually dividing the inspection region into squares in units of predetermined dimensions, and outputs n-bit occupancy rate data. For example, it is preferable to set one square as one pixel. Assuming that one pixel has a resolution of $1/2^8$ (=$1/256$), the occupancy rate in each pixel is calculated by allocating small regions which correspond to the region of figures arranged in the pixel and each of which corresponds to $1/256$ resolution. Then, 8-bit occupancy rate data is output to the reference image generation circuit 112. The square region (inspection pixel) may be in accordance with the pixel of measured data.

Next, the reference image generation circuit 112 performs filtering processing on design image data of a design pattern which is image data of a figure, using a filter function F to which a calculated coefficient has been applied. Thereby, it is possible to match/fit the design image data being image data on the design side, whose image intensity (gray scale level) is represented by digital values, with image generation characteristics obtained by irradiation with a representative beam (e.g., center beam) of the multiple primary electron beams 20. The generated image data of a reference image is output to the comparison circuit 108.

In the alignment step (S208), the alignment unit 57 reads a mask die image serving as an image to be inspected and a reference image corresponding to the mask die image, and provides alignment between the images, based on units of sub-pixels smaller than units of pixels. For example, the alignment can be performed using a least-squares method. Preferably, the pixel size is set to be, for example, a region being approximately the same as each beam size of the multiple primary electron beams 20. Therefore, the sub-irradiation region 29 to be scanned by each beam is composed of n×n pixels. For example, it is composed of 16×16 pixels.

In the comparison step (S210), the comparison unit 58 compares the mask die image (secondary electron image) with the reference image. The comparison unit 58 compares them, for each pixel, based on predetermined determination conditions in order to determine whether there is a defect such as a shape defect. For example, if a gray scale level difference of each pixel is larger than the determination threshold Th, it is determined that there is a defect. Then, the comparison result is output to the storage device 109, the monitor 117, or the memory 118, or alternatively, output from the printer 119.

Also, in the case of the die-to-database inspection, since difference between the images resulting from shape difference of primary electron beams has been corrected, false (pseudo) defect(s) can be reduced even when comparing with a reference image. In the first embodiment, since each measured image is corrected in the direction increasing the blur amount, correction should be applied to the reference image similarly to the measured image when performing filtering on the reference image.

Figure 20:
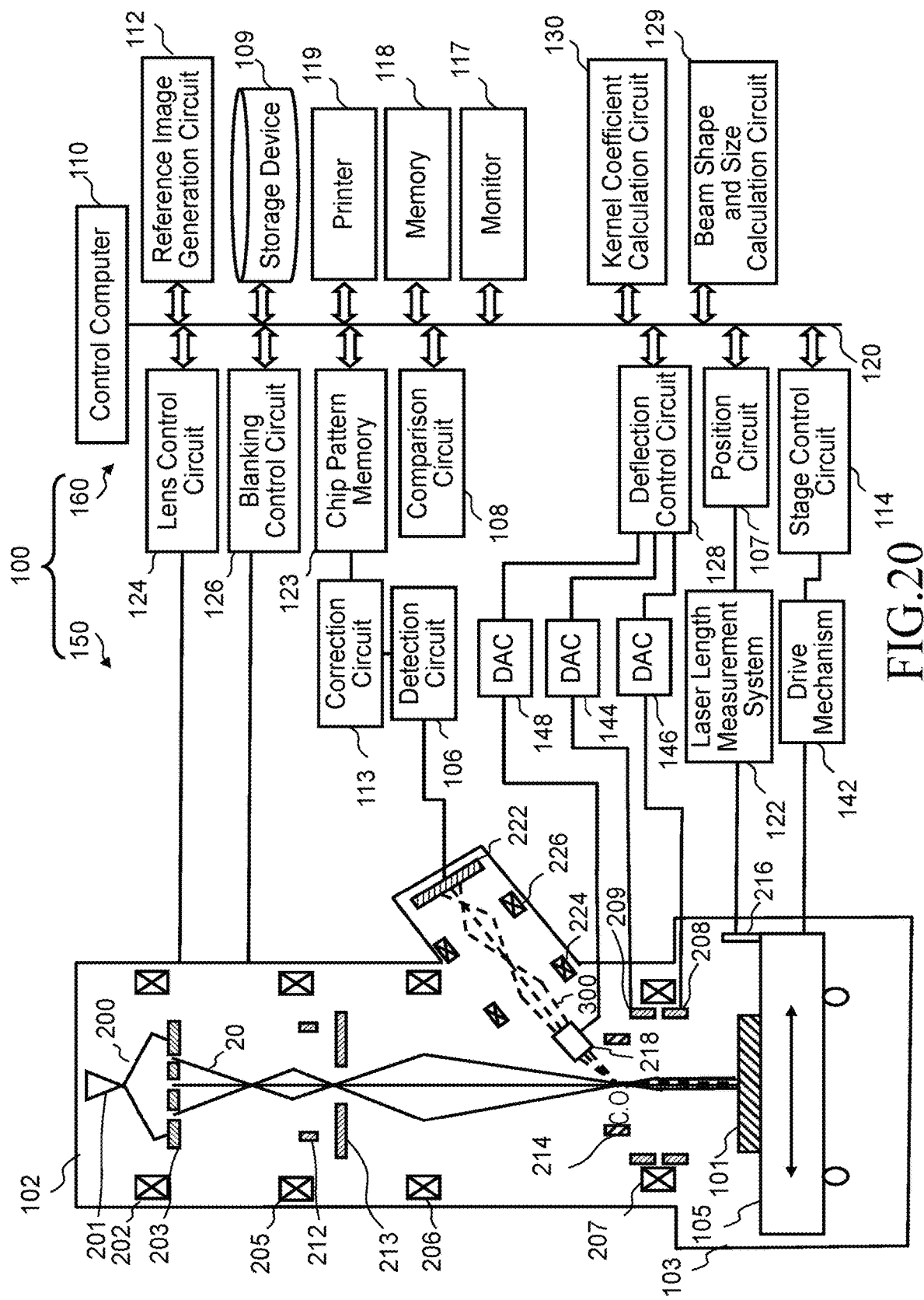
FIG. 20 is a block diagram showing a modified example of configuration of a pattern inspection apparatus according to the first embodiment.

FIG. 20 is a block diagram showing a modified example of configuration of a pattern inspection apparatus according to the first embodiment. FIG. 20 is the same as FIG. 1 except that the arrangement position of the chip pattern memory 123 and the correction circuit 113 is reversed. That is, it is also preferable to first correct, by the correction circuit 113, image data corresponding to each primary electron beam 13i detected by the multi-detector 222, and then to store the data in the chip pattern memory 123. The image data having been corrected is transmitted from the chip pattern memory 123 to the comparison circuit 108.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the correction circuit 113, the stage control circuit 114, the lens control circuit 124, the blanking control circuit 126, the deflection control circuit 128, the beam shape and size calculation circuit 129, and the kernel coefficient calculation circuit 130 may be configured by at least one processing circuit described above.

Embodiments have been explained referring to specific examples described above. However, the present invention is not limited to these specific examples. Although FIG. 1 describes the case where the multiple primary electron beams 20 are formed by the shaping aperture array substrate 203 irradiated with one beam from one irradiation source, namely, the electron gun 201, it is not limited thereto. The multiple primary electron beams 20 may be formed by individual irradiation with primary electron beams from a plurality of irradiation sources.

While the apparatus configuration, control method, and the like not directly necessary for explaining the present invention are not described, some or all of them can be appropriately selected and used on a case-by-case basis when needed.

In addition, any other multiple electron beam inspection apparatus and multiple electron beam inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam inspection apparatus comprising:
    a secondary electron image acquisition mechanism that acquires a secondary electron image by applying multiple primary electron beams to a substrate where figure patterns are formed, and detecting multiple secondary electron beams emitted from the substrate by irradiation with the multiple primary electron beams;
    a correction circuit that corrects a partial secondary electron image of partial secondary electron images which configure the secondary electron image such that the partial secondary electron image becomes close to a uniform beam partial image which is acquired by the secondary electron image acquisition mechanism in a case where an irradiation region of a primary electron beam corresponding to the partial secondary electron image is irradiated with a uniform beam obtained by equalizing shapes and sizes of all primary electron beams of the multiple primary electron beams, using a function for individual correction of each primary electron beam of the multiple primary electron beams, for each of the partial secondary electron images; and
    an inspection circuit that performs inspection using the partial secondary electron images each corrected.

2. The apparatus according to claim 1, wherein a coefficient of the function for individual correction of the each primary electron beam of the multiple primary electron beams is acquired using a secondary electron image of an evaluation pattern which is obtained by the irradiation with the each primary electron beam of the multiple primary electron beams.

3. The apparatus according to claim 2, wherein, as the uniform beam, a true circle of a predetermined size greater than or equal to a maximum size of each beam size of the multiple primary electron beams is used.

4. The apparatus according to claim 2 further comprising:
    a beam shape and size calculation circuit that calculates, in assuming that a beam shape of a primary electron beam on the substrate is an ellipse, a beam radius in a long axis direction of the ellipse, a beam radius in a short axis direction of the ellipse, and an angle in the long axis direction of the ellipse, using the secondary electron image of the evaluation pattern obtained by the irradiation with the primary electron beam, for the each primary electron beam of the multiple primary electron beams; and
    an extraction circuit that extracts a maximum beam radius in the long axis direction from all beam shapes of the multiple primary electron beams on the substrate,
    wherein, for the each primary electron beam, the correction circuit corrects, using the function for individual correction of the each primary electron beam, the partial secondary electron image such that a difference between a predetermined beam radius, being greater than or equal to the maximum beam radius, and the beam radius in the long axis direction of the primary electron beam, and a difference between the predetermined beam radius and the beam radius in the short axis direction of the primary electron beam are compensated.

5. The apparatus according to claim 1, wherein
    the secondary electron image acquisition mechanism includes a multi-detector in which a plurality of detection sensors are arranged, where each of the detection sensors detects a secondary electron beam caused by irradiation with a corresponding primary electron beam of the multiple primary electron beams, and outputs image data,
    the correction circuit includes a plurality of sub correction circuits whose number is greater than or equal to that of beams of the multiple primary electron beams, and
    each sub correction circuit of the sub correction circuits is assigned to a detection sensor such that the each sub correction circuit inputs image data from any one of the detection sensors in the multi-detector, where each of the detection sensors corresponds to one of the sub correction circuits which is different from others.

6. A multiple electron beam inspection method comprising:
    acquiring a secondary electron image by applying multiple primary electron beams to a substrate where figure patterns are formed, and detecting multiple secondary electron beams emitted from the substrate by irradiation with the multiple primary electron beams;
    correcting a partial secondary electron image of partial secondary electron images which configure the secondary electron image such that the partial secondary electron image becomes close to a uniform beam partial image which is acquired by irradiating an irradiation region of a primary electron beam corresponding to the partial secondary electron image with a uniform beam obtained by equalizing shapes and sizes of all primary electron beams of the multiple primary electron beams, using a function for individual correction of each primary electron beam of the multiple primary electron beams, for each of the partial secondary electron images; and
    performing inspection using the partial secondary electron images each corrected.

7. The method according to claim 6, wherein a coefficient of the function for individual correction of the each primary electron beam of the multiple primary electron beams is acquired using a secondary electron image of an evaluation pattern which is obtained by the irradiation with the each primary electron beam of the multiple primary electron beams.

8. The method according to claim 7, wherein, as the uniform beam, a true circle of a predetermined size greater than or equal to a maximum size of each beam size of the multiple primary electron beams is used.

9. The method according to claim 7 further comprising:
calculating, in assuming that abeam shape of a primary electron beam on the substrate is an ellipse, a beam radius in a long axis direction of the ellipse, a beam radius in a short axis direction of the ellipse, and an angle in the long axis direction of the ellipse, using the secondary electron image of the evaluation pattern obtained by the irradiation with the primary electron beam, for the each primary electron beam of the multiple primary electron beams; and
extracting a maximum beam radius in the long axis direction from all beam shapes of the multiple primary electron beams on the substrate,
wherein, for the each primary electron beam, using the function for individual correction of the each primary electron beam, the partial secondary electron image is corrected such that a difference between a predetermined beam radius, being greater than or equal to the maximum beam radius, and the beam radius in the long axis direction of the primary electron beam, and a difference between the predetermined beam radius and the beam radius in the short axis direction of the primary electron beam are compensated.

10. The method according to claim 6, wherein
a secondary electron beam caused by irradiation with a corresponding primary electron beam of the multiple primary electron beams is detected by a plurality of detection sensors in a multi-detector, and image data is output,
the correction is performed by a plurality of sub correction circuits, and
each sub correction circuit of the sub correction circuits is assigned to a detection sensor such that image data is input from any one of the detection sensors in the multi-detector, where each of the detection sensors corresponds to one of the sub correction circuits which is different from others.

* * * * *